(12) United States Patent
Kwack

(10) Patent No.: US 7,807,486 B2
(45) Date of Patent: Oct. 5, 2010

(54) LIQUID CRYSTAL DISPLAY DEVICE AND METHOD OF FABRICATING THE SAME

(75) Inventor: Hee-Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/285,137

(22) Filed: Sep. 29, 2008

(65) Prior Publication Data
US 2009/0101908 A1 Apr. 23, 2009

(30) Foreign Application Priority Data
Oct. 17, 2007 (KR) ............. 10-2007-0104784

(51) Int. Cl.
*H01L 21/00* (2006.01)
(52) U.S. Cl. ............. 438/30; 257/79; 257/98
(58) Field of Classification Search ............. 257/79, 257/98; 438/30
See application file for complete search history.

(56) References Cited

U.S. PATENT DOCUMENTS

| | | | | |
|---|---|---|---|---|
| 2002/0158994 A1* | 10/2002 | Hashimoto et al. | ............ | 349/43 |
| 2004/0214360 A1* | 10/2004 | Shih | ............. | 438/30 |
| 2006/0092364 A1* | 5/2006 | Chung | ............ | 349/141 |
| 2006/0256249 A1* | 11/2006 | Nagano et al. | ............ | 349/43 |
| 2007/0018169 A1* | 1/2007 | Lee et al. | ............ | 257/72 |
| 2008/0158458 A1* | 7/2008 | Yang | ............ | 349/43 |

* cited by examiner

*Primary Examiner*—Zandra Smith
*Assistant Examiner*—Jamie Niesz
(74) *Attorney, Agent, or Firm*—McKenna Long & Aldridge LLP

(57) ABSTRACT

A method of fabricating an LCD device includes forming a gate line, a gate electrode, a gate pad electrode at an end of the gate line, and a common line on a substrate; forming a gate insulating layer on the gate electrode; forming an active layer on the gate insulating layer; forming an etch stopper on the active layer; forming first and second ohmic contact layers spaced apart from each other on the active layer and an impurity-doped amorphous silicon pattern contacting the gate insulating layer therebelow, outer sides of the first and second ohmic contact layers being outside the active layer; forming a data line crossing the gate line to define a pixel region, a data pad electrode at an end of the data line, and source and drain electrodes on the first and second ohmic contact layers, respectively; forming a pixel electrode and a common electrode in the pixel region to induce an in-plane electric field; and forming a gate pad terminal electrode on the gate pad electrode. At least one of the data line, the pixel electrode and the common electrode contacts the impurity-doped amorphous silicon pattern therebelow.

9 Claims, 28 Drawing Sheets

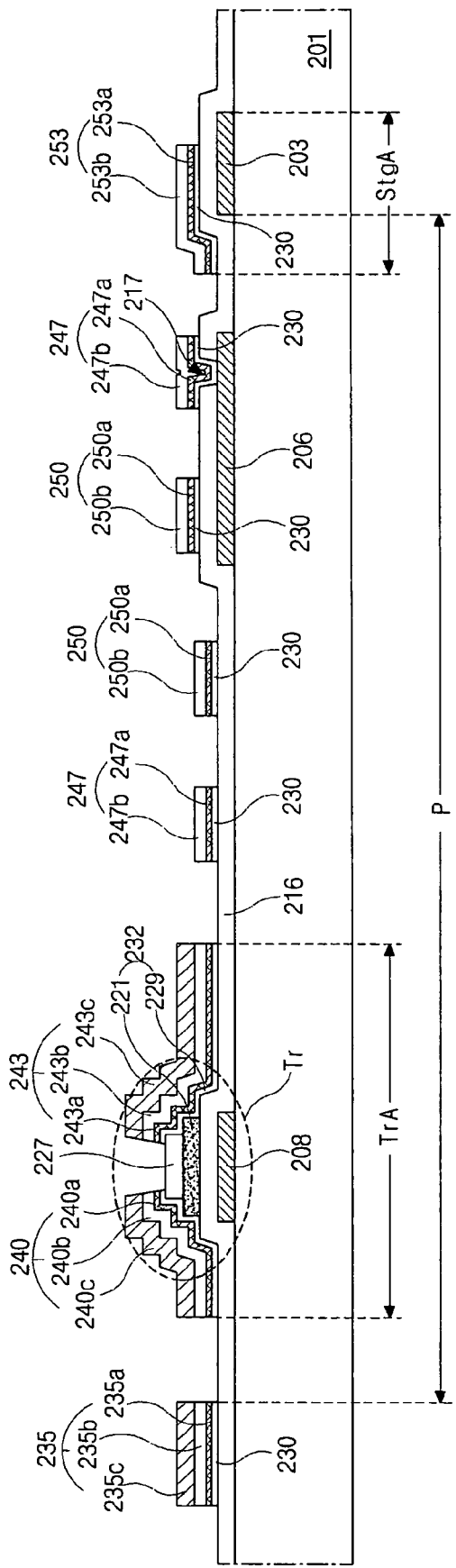

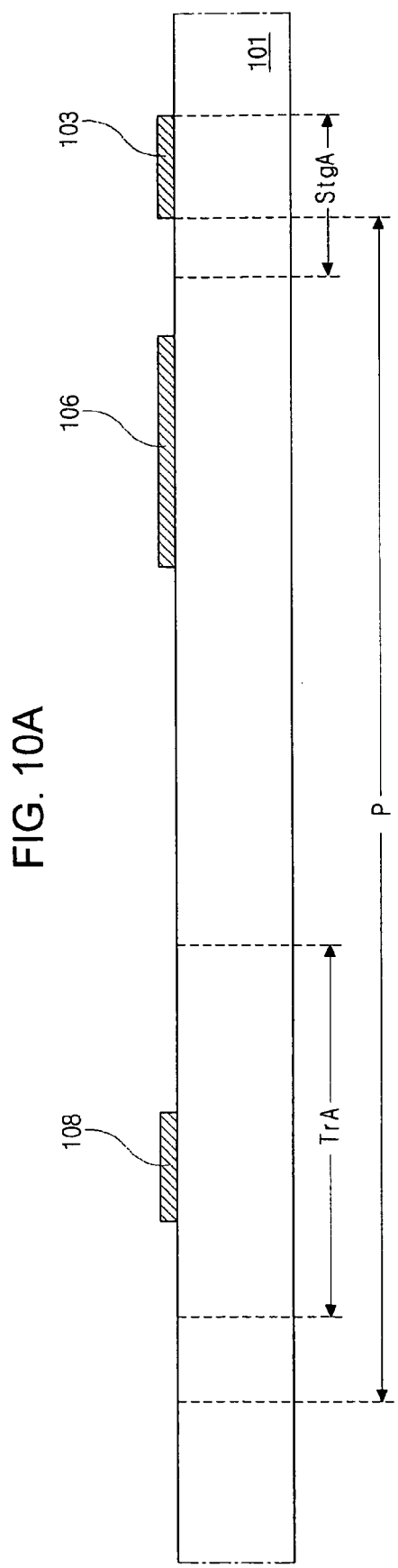

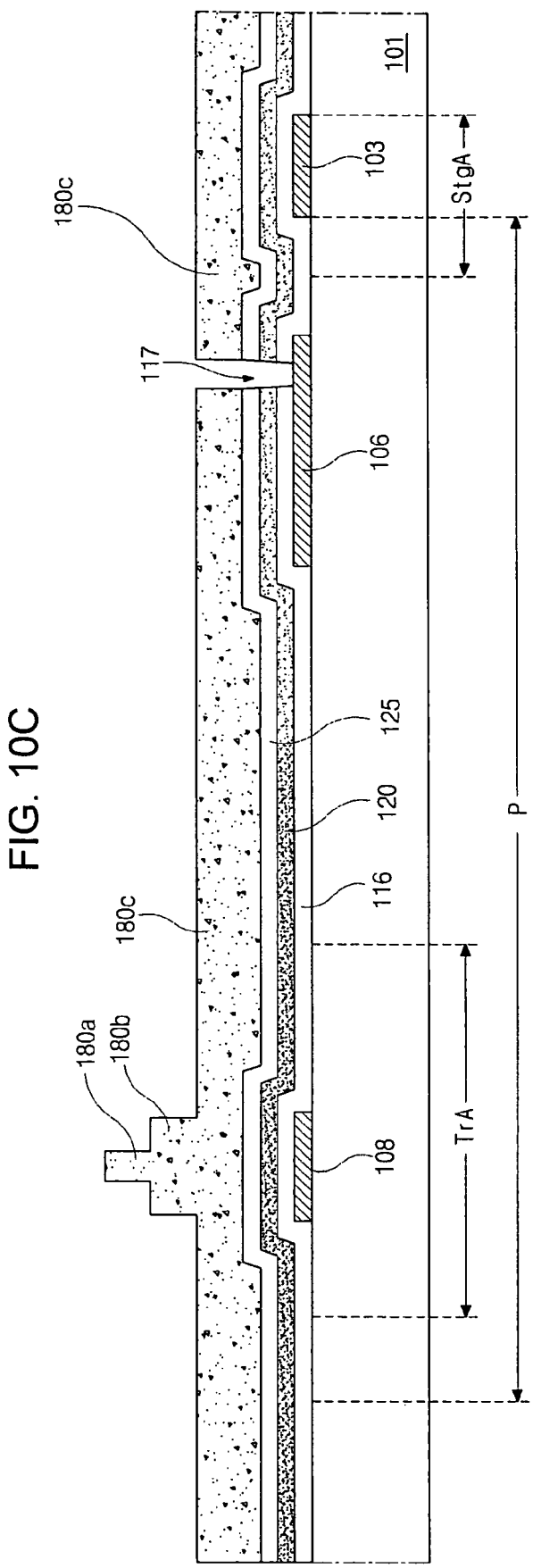

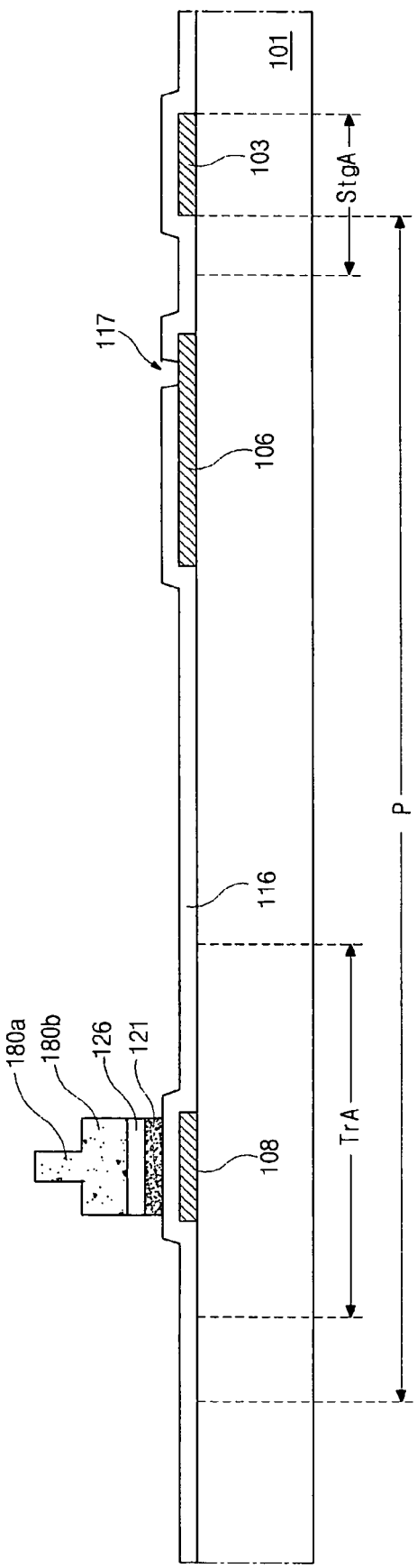
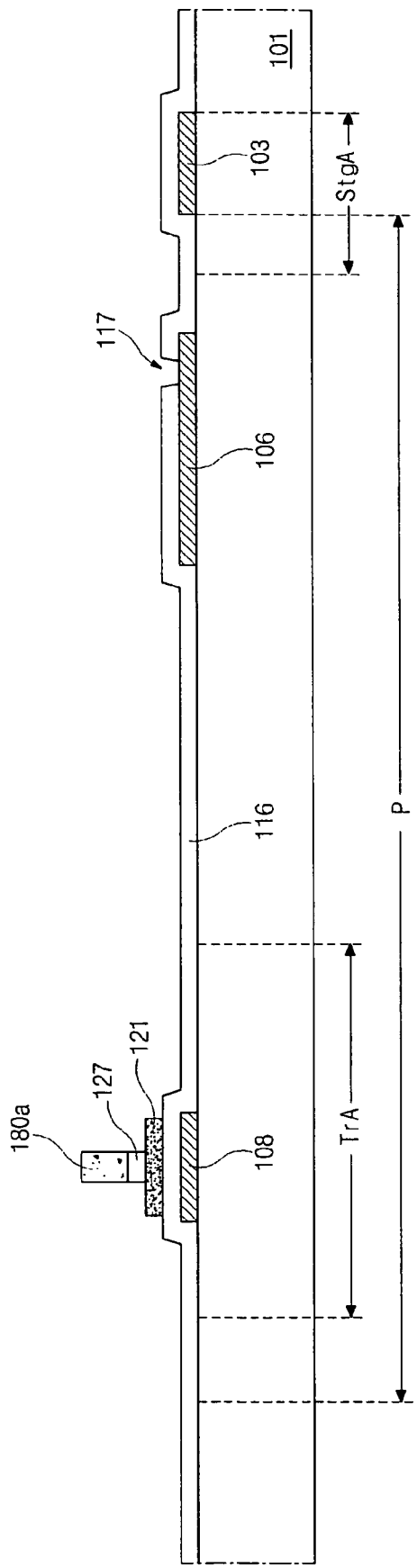
FIG. 10D
FIG. 10E

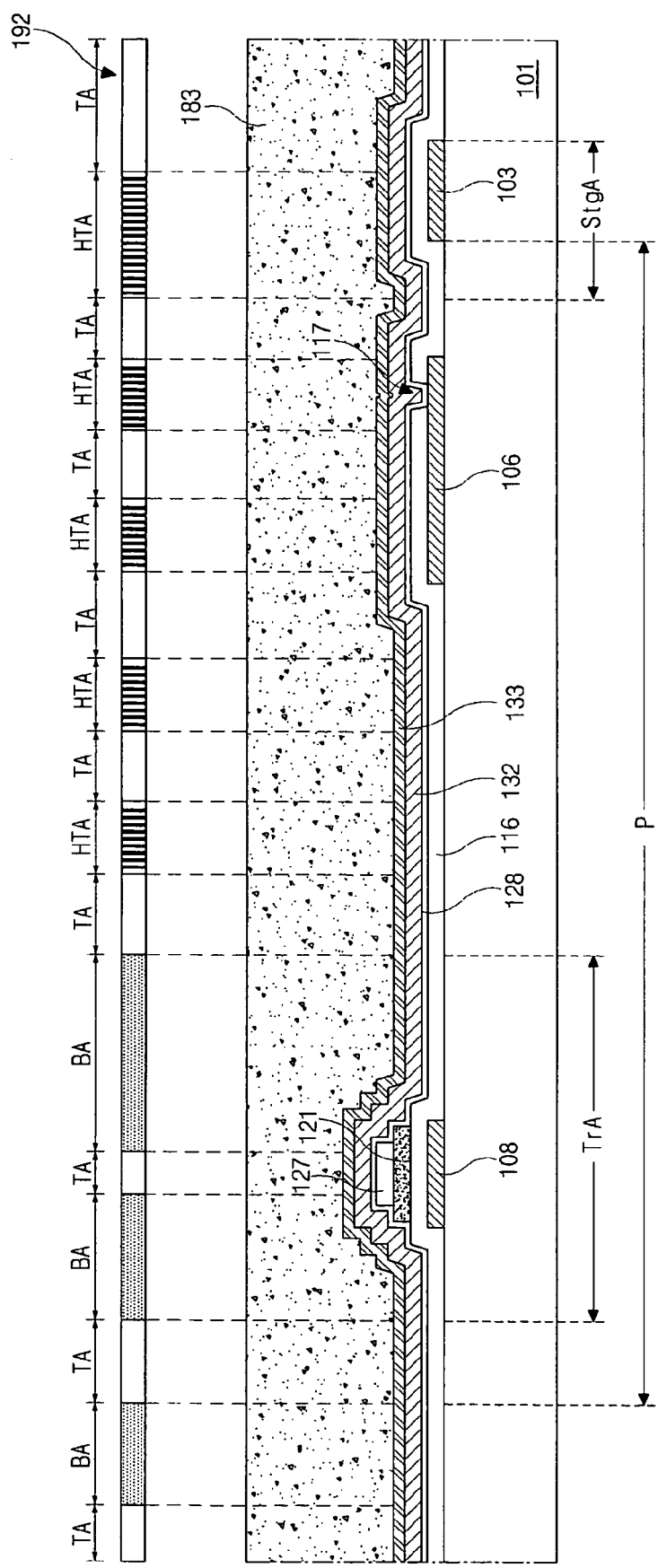

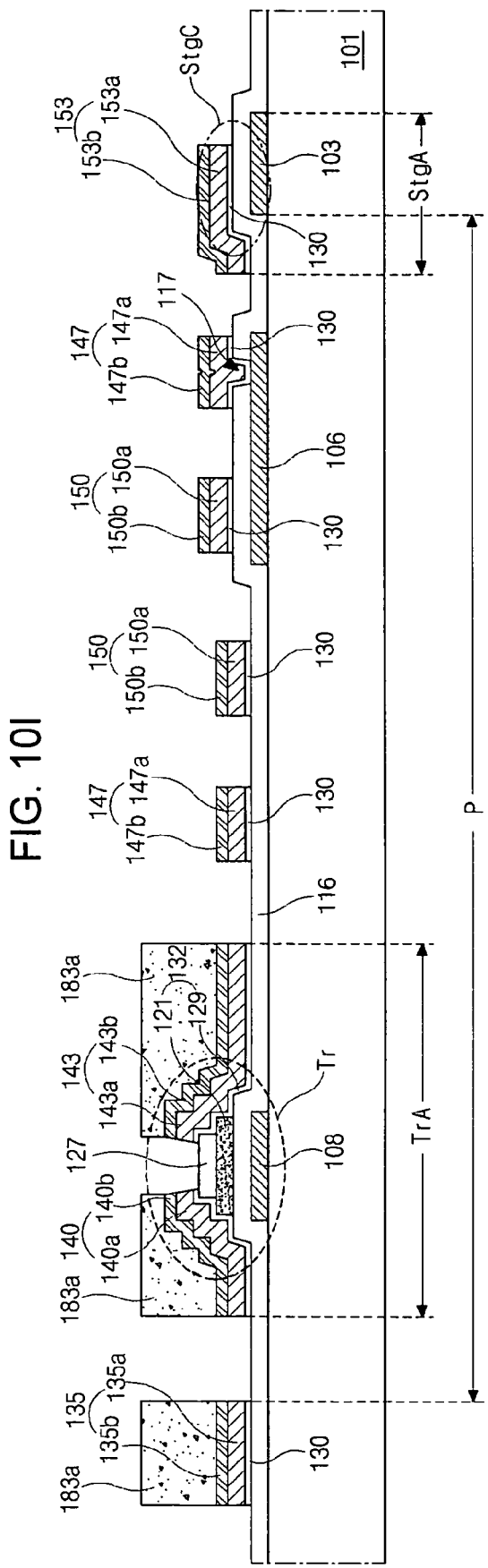

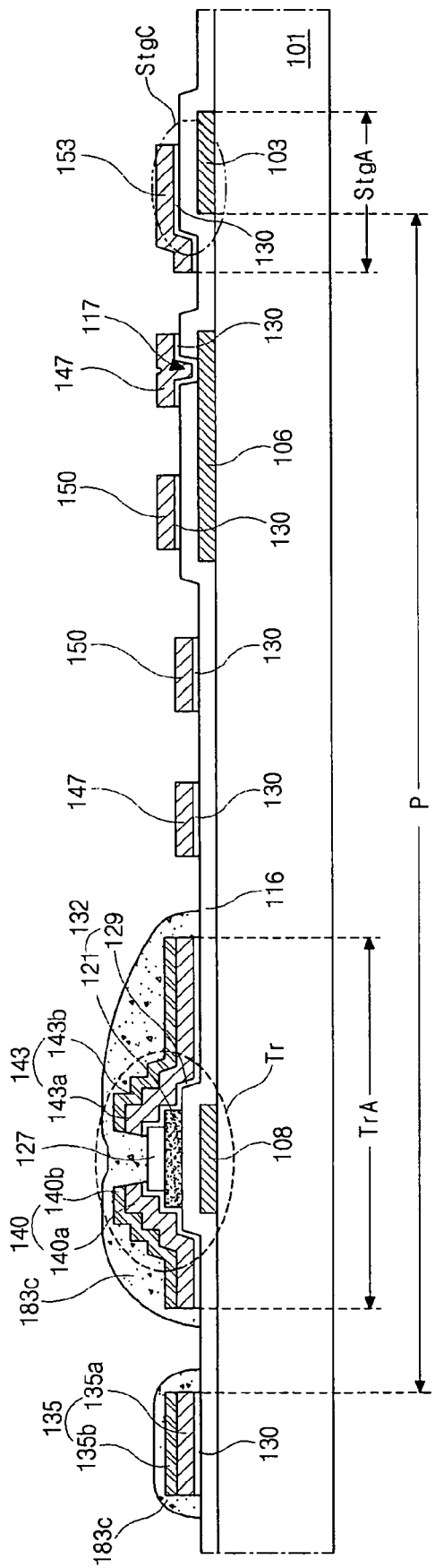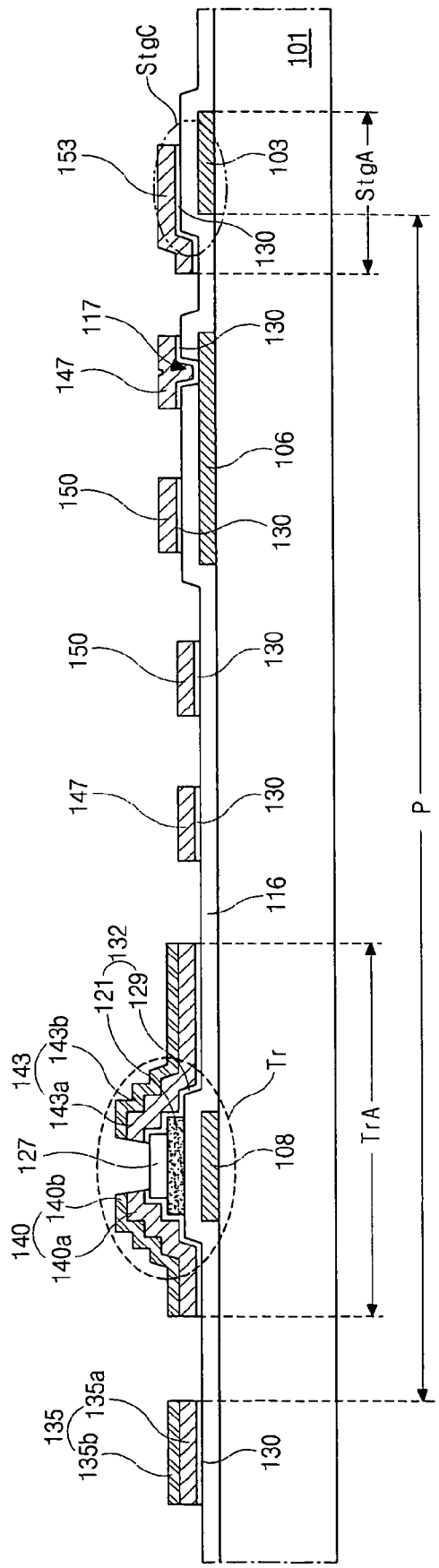

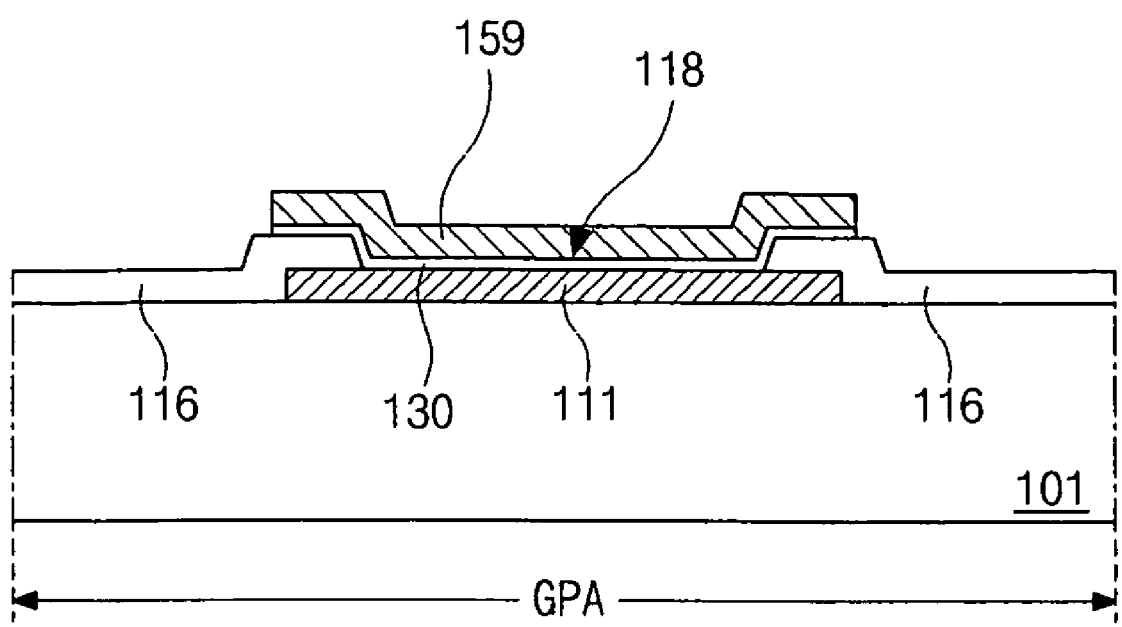
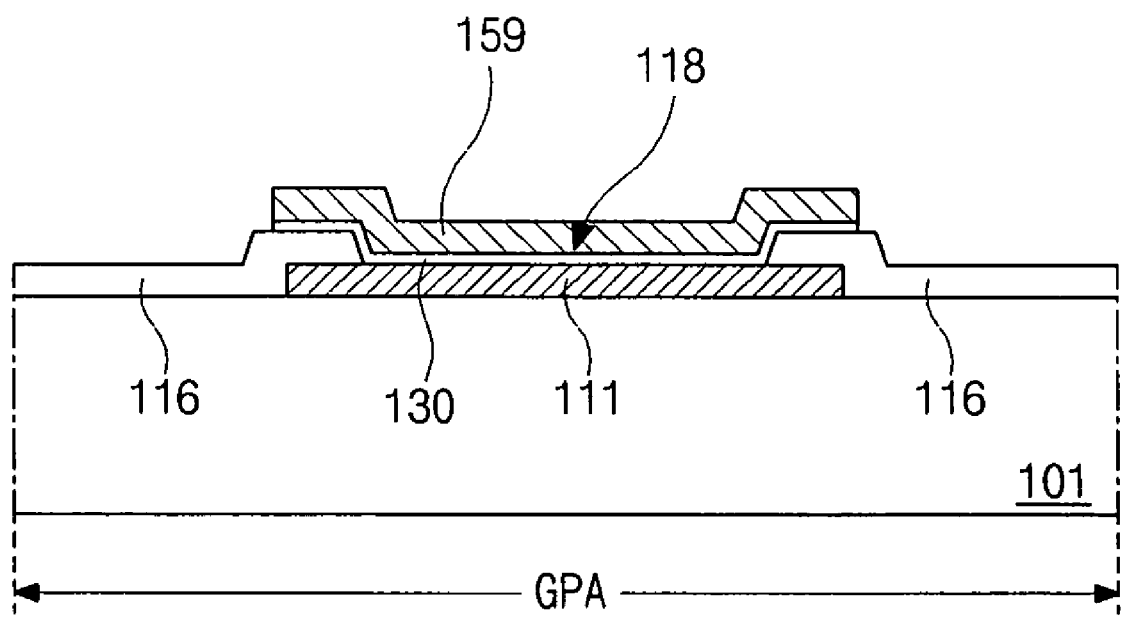

LIQUID CRYSTAL DISPLAY DEVICE AND METHOD OF FABRICATING THE SAME

The present invention claims the benefit of Korean Patent Application No. 2007-0104784, filed in Korea on Oct. 17, 2007, which is hereby incorporated by reference for all purposes as if fully set forth herein.

BACKGROUND OF THE INVENTION

1. Field of the Invention

The present invention relates to a liquid crystal display device, and more particularly, to a liquid crystal display (LCD) device and a method of fabricating the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

The LCD device operated by the vertically induced electric field has a disadvantage in failing to achieve a wide viewing angle. To achieve a wide viewing angle, an IPS-LCD (in-plane switching mode LCD) device is suggested. The IPS-LCD device is operated by an in-plane electric field.

FIG. 1 is a view illustrating an IPS-LCD device according to the related art.

Referring to FIG. 1, the LCD device includes a lower substrate 10 referred to as an array substrate, an upper substrate 9 referred to as a color filter substrate, and a liquid crystal layer 11 between the two substrates 9 and 10. A common electrode 30 and a pixel electrode 17 are formed at the lower substrate 10 and induce an in-plane electric field L, and liquid crystal molecules of the liquid crystal layer 11 are operated by the in-plane electric field L.

FIGS. 2A and 2B are views illustrating the LCD device in off and on states, respectively, according to the related art.

Referring to FIGS. 2A and 2B, when the off state changes into the on state, an in-plane electric field L is induced between the common electrode 17 and the pixel electrode 30. While alignment of liquid crystal molecules 11a over the common electrode 17 and the pixel electrode 30 do not change, alignment of liquid crystal molecules 11b between the common electrode 17 and the pixel electrode 30 change in accordance with the in-plane electric field L. Since the liquid crystal molecules are arranged in according with the in-plane electric field, wide viewing angle can be achieved.

FIG. 3 is a plan view illustrating an array substrate of an IPS-LCD device according to the related art, and FIG. 4 is a cross-sectional view taken along a line IV-IV of FIG. 3.

Referring to FIGS. 3 and 4, the array substrate includes a gate line 43 and a data line 60 crossing each other to define a pixel region P on a substrate 40. A common line 47 is spaced apart from the gate line 43.

A thin film transistor Tr is located in a switching region TrA at the crossing of the gate and data lines 43 and 60. The thin film transistor Tr includes a gate electrode 45, a semiconductor layer 51, and source and drain electrodes 53 and 55.

In the pixel region P, a plurality of pixel electrodes 70a and 70b and a plurality of common electrodes 49a and 49b are arranged alternately. The pixel electrodes 70a and 70b are connected to a connection pattern 69, and the connection pattern 69 is connected to the drain electrode 55. The common electrodes 49a and 49b are connected to the common line 47.

The array substrate is fabricated with five mask processes. For example, a first metal material is deposited on the substrate 40 and patterned in a first mask process to form a gate electrode 45, the gate line 43, the common electrodes 49a and 49b and the common line 47. A gate insulating layer 50 is formed on the substrate 40 having the gate electrode 45.

An intrinsic amorphous silicon (a-Si) layer and an impurity-doped amorphous silicon layer are sequentially formed on the gate insulating layer 50 and patterned in a second mask process to form a semiconductor layer 51. The semiconductor layer 51 includes an active layer 51a made of the intrinsic amorphous silicon and an ohmic contact layer 51b made of the impurity-doped amorphous silicon.

A second metal material is deposited on the substrate 40 having the semiconductor layer 51 and patterned in a third mask process to form the source and drain electrodes 53 and 55, and the data line 60. The ohmic contact layer 51b between the source and drain electrodes 53 and 55 is removed.

A passivation layer 65 is formed on the substrate 40 having the source and drain electrodes 53 and 55 and patterned in a fourth mask process to form a drain contact hole 67 exposing the drain electrode 55.

A transparent conductive material is deposited on the passivation layer 65 and patterned in a fifth mask process to form the pixel electrodes 49a and 49b.

Through the above-described five mask processes, the array substrate is fabricated. However, since production time and cost increase as mask processes increase, it is needed to decrease the number of the mask processes.

FIG. 5 is a view illustrating an array substrate of an IPS-LCD device fabricated with four mask processes according to the related art.

Referring to FIG. 5, one mask process decreases compared to FIG. 4. That is, source and drain electrodes 84 and 86 and a data line 82 are formed in the same mask process of forming a semiconductor layer 79. Accordingly, a semiconductor pattern 80 having the same stacking structure as the semiconductor layer 79 is formed below the data line 82. The semiconductor layer 79 includes an active layer 79a made of intrinsic amorphous silicon and an ohmic contact layer 79b made of impurity-doped amorphous silicon, and in a similar manner, the semiconductor pattern 80 includes a first pattern 80a made of intrinsic amorphous silicon and a second pattern 80b made of impurity-doped amorphous silicon. Common electrodes 75a and 75b are formed in the same process of forming a gate electrode 77 in a switching region TrA, and the source and drain electrodes 84 and 86 contact the ohmic contact layer 79b. A connection pattern 90 contacts the drain electrode 86 through a drain contact hole 89 in a passivation layer 88, and pixel electrodes 91a and 91b are connected to the connection pattern 90. A gate insulating layer 78 is on the gate electrode 77.

Since the active layer 79a protrudes outside the ohmic contact layer 79b and the first pattern 80a protrudes outside the second pattern 80b, photo current of a thin film transistor Tr increases and off current thus increases. Further, since the first pattern 80a protrudes outside the second pattern 80b, wavy noise occurs when backlight is on or off, and aperture ratio decreases. Accordingly, display quality is degraded in the related art IPS-LCD device.

SUMMARY OF THE INVENTION

Accordingly, the present invention is directed to a liquid crystal display device and method of fabricating the same that substantially obviates one or more of the problems due to limitations and disadvantages of the related art.

An advantage of the present invention is to provide a liquid crystal display device and method of fabricating the same that can improve display quality.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating a liquid crystal display device includes forming a gate line, a gate electrode, a gate pad electrode at an end of the gate line, and a common line on a substrate; forming a gate insulating layer on the gate electrode; forming an active layer on the gate insulating layer; forming an etch stopper on the active layer; forming first and second ohmic contact layers spaced apart from each other on the active layer and an impurity-doped amorphous silicon pattern contacting the gate insulating layer therebelow, outer sides of the first and second ohmic contact layers being outside the active layer; forming a data line crossing the gate line to define a pixel region, a data pad electrode at an end of the data line, and source and drain electrodes on the first and second ohmic contact layers, respectively; forming a pixel electrode and a common electrode in the pixel region to induce an in-plane electric field; and forming a gate pad terminal electrode on the gate pad electrode, wherein at least one of the data line, the pixel electrode and the common electrode contacts the impurity-doped amorphous silicon pattern therebelow.

In another aspect, a liquid crystal display device includes a gate line, a gate electrode, a gate pad electrode at an end of the gate line, and a common line on a substrate; a gate insulating layer on the gate electrode; an active layer on the gate insulating layer; an etch stopper on the active layer; first and second ohmic contact layers spaced apart from each other on the active layer and an impurity-doped amorphous silicon pattern contacting the gate insulating layer therebelow, outer sides of the first and second ohmic contact layers being outside the active layer; a data line crossing the gate line to define a pixel region, a data pad electrode at an end of the data line, and source and drain electrodes on the first and second ohmic contact layers, respectively; a pixel electrode and a common electrode in the pixel region to induce an in-plane electric field; and a gate pad terminal electrode on the gate pad electrode, wherein at least one of the data line, the pixel electrode and the common electrode contacts the impurity-doped amorphous silicon pattern therebelow.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 7B, 8B and 9B are cross-sectional views illustrating an array substrate according to a second embodiment of the present invention.

FIGS. 10A to 10K are cross-sectional views illustrating fabrication processes of a portion, taken along a line VII-VII of FIG. 6, of the array substrate of the IPS-LCD device according to the first embodiment of the present invention;

FIGS. 11A to 11K are cross-sectional views illustrating fabrication processes of a gate pad portion of the array substrate of the IPS-LCD device according to the first embodiment of the present invention.

DETAILED DESCRIPTION OF THE ILLUSTRATED EMBODIMENTS

Reference will now be made in detail to embodiments of the present invention, which are illustrated in the accompanying drawings.

Figure 1:
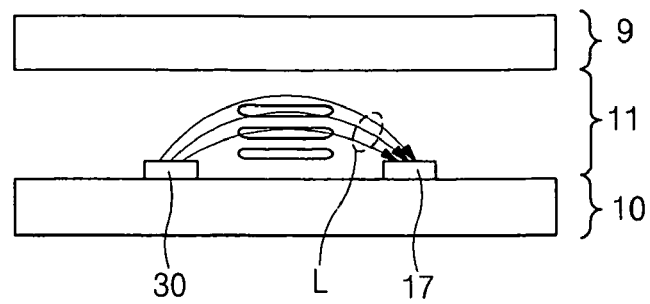
FIG. 1 is a view illustrating an IPS-LCD device according to the related art.
Figure 2A:
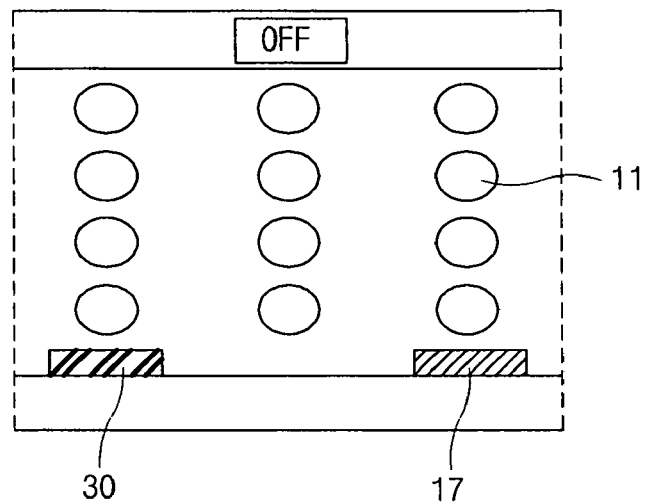
FIGS. 2A and 2B are views illustrating the LCD device in off and on states, respectively, according to the related art.
Figure 2B:
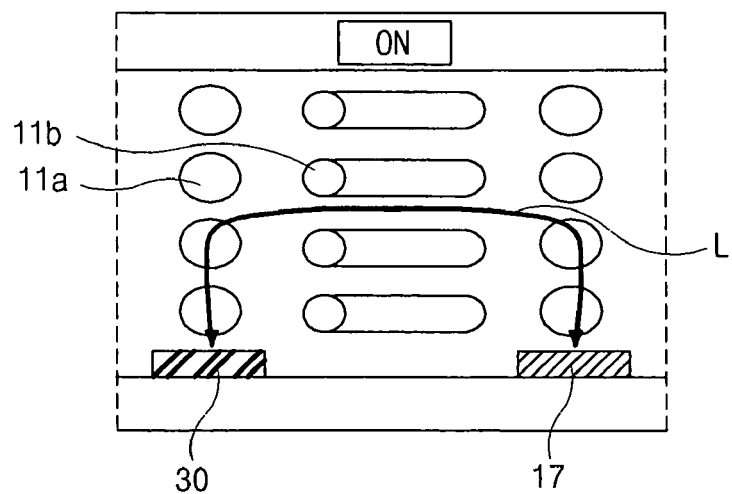
Figure 3:
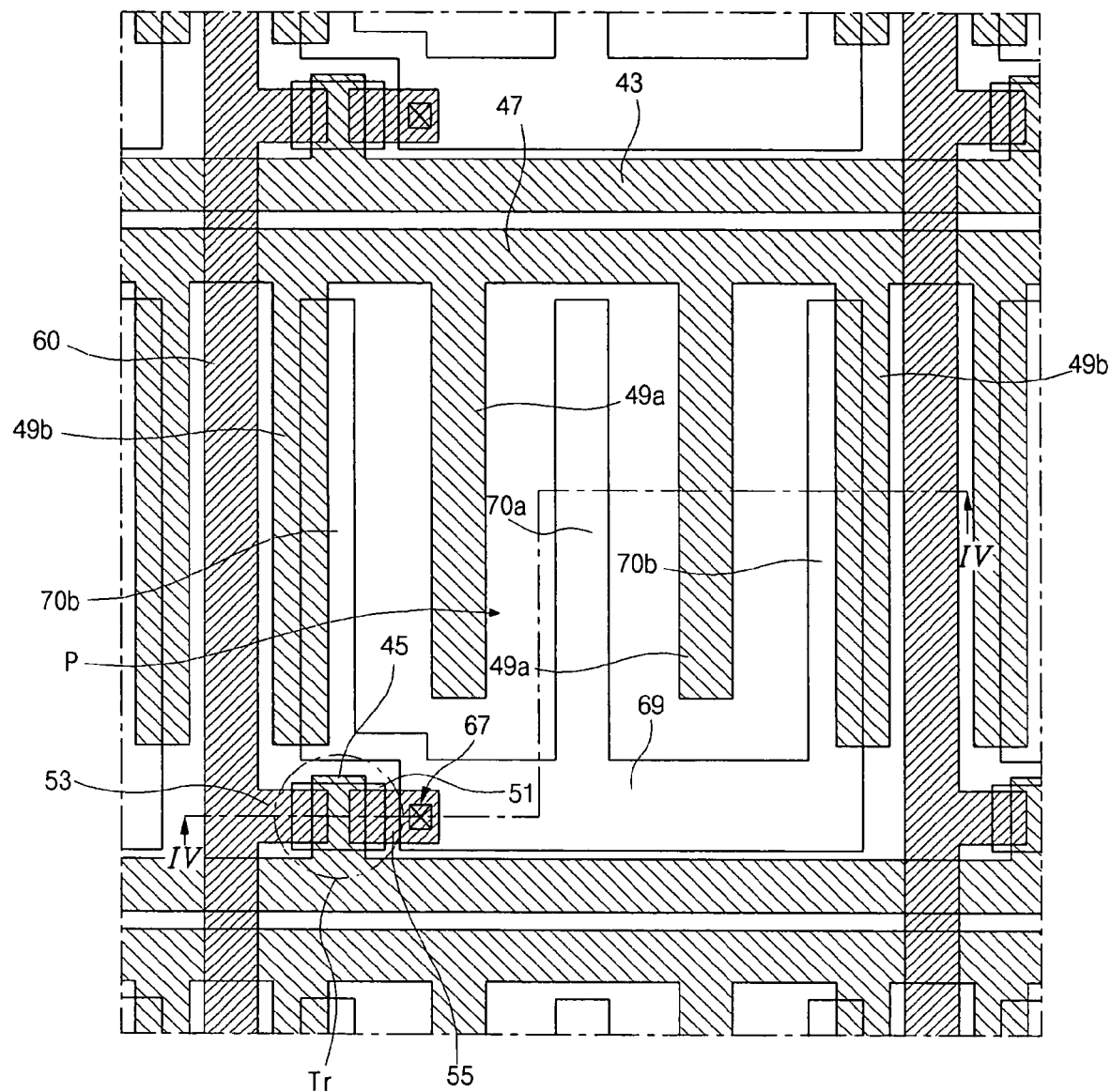
FIG. 3 is a plan view illustrating an array substrate of an IPS-LCD device according to the related art.
Figure 4:
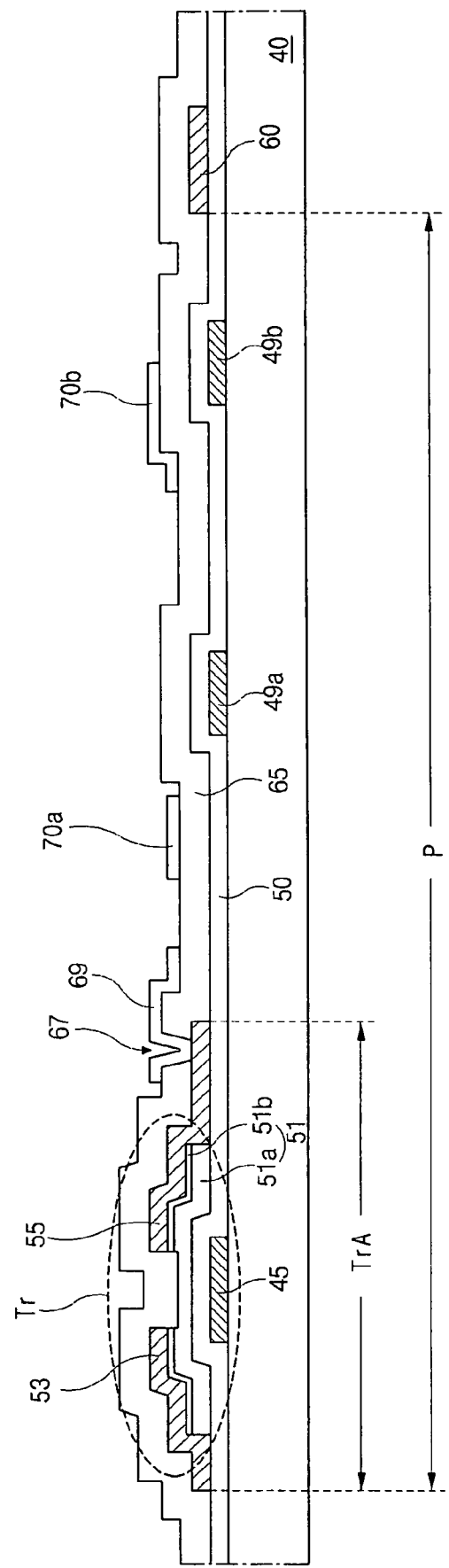
FIG. 4 is a cross-sectional view taken along a line IV-IV of FIG. 3.
Figure 5:
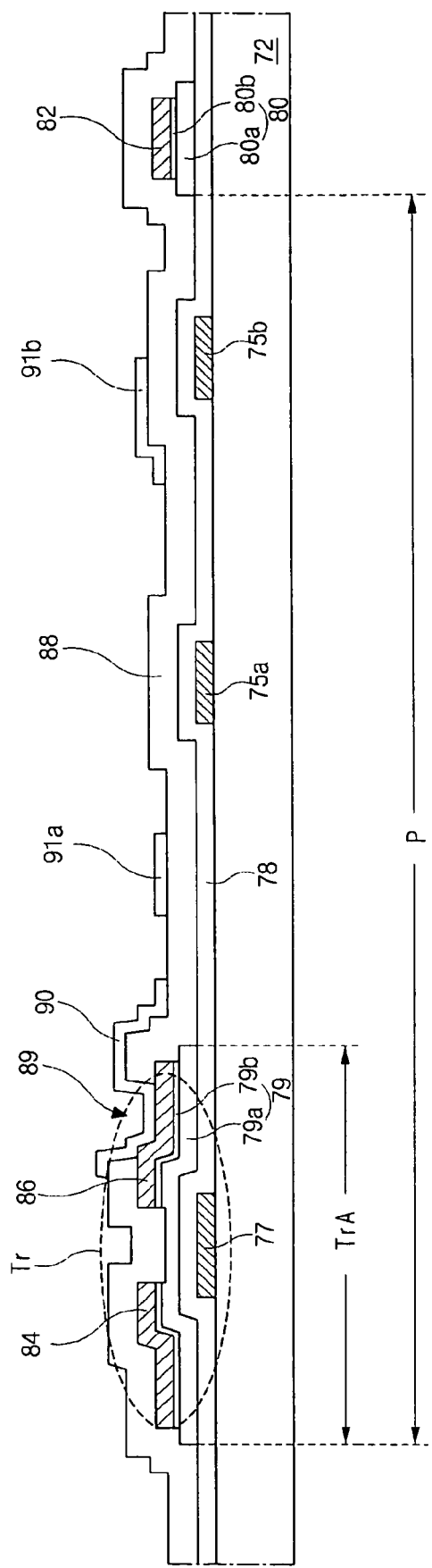
FIG. 5 is a view illustrating an array substrate of an IPS-LCD device fabricated with four mask processes according to the related art.
Figure 6:
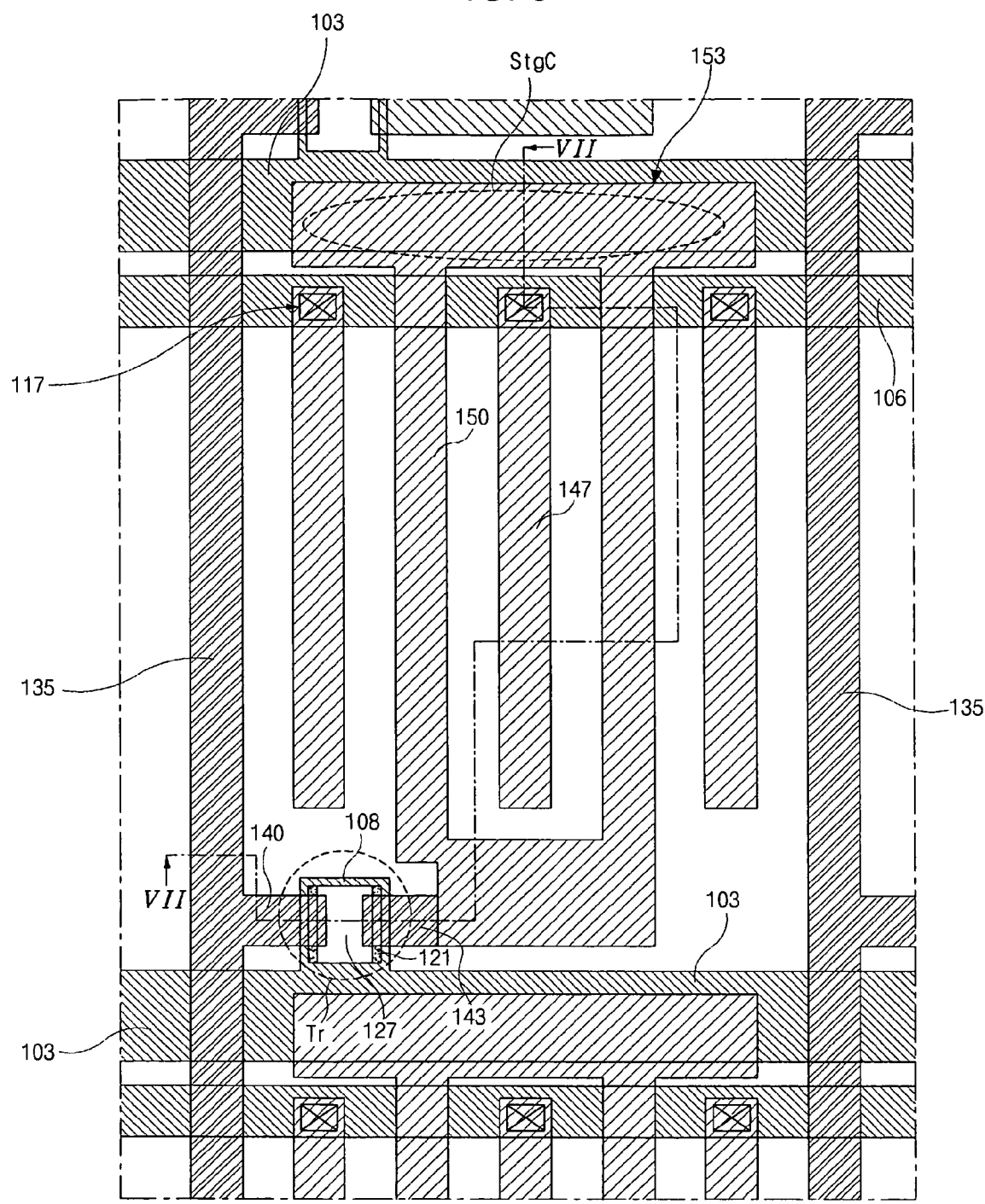
FIG. 6 is a plan view illustrating an array substrate of an IPS-LCD device according to a first embodiment of the present invention.

FIG. 6 is a plan view illustrating an array substrate of an IPS-LCD device according to a first embodiment of the present invention.

Referring to FIG. 6, in the array substrate of the IPS-LCD device according to the first embodiment of the present invention, a gate line 103 and a data line 135 cross each other on a substrate 101 to define a pixel region. A common line 106 is spaced apart from and parallel to the gate line 103.

A thin film transistor Tr is located at the crossing of the gate and data lines 103 and 135. The thin film transistor Tr includes a gate electrode 108, a semiconductor layer, and source and drain electrodes 140 and 143. The thin film transistor Tr may have various structures. For example, the source electrode 140 may protrude from the data line 135, and the gate electrode 108 may protrude from the gate line 103. Alternatively, the source electrode 140 may have a U shape, and the drain electrode 143 may insert into an inner space of the U-shaped source electrode 140.

A plurality of pixel electrodes 150 and a plurality of common electrodes 147 are alternately arranged in the pixel region. The pixel electrodes 150 are connected to the drain electrode 143, and the common electrodes 147 are connected to the common line 106. The common electrode 147 may contact the common line 106 through common contact holes 117. One end of the pixel electrodes 150 may be connected to a connection portion 153. The connection portion 153 may overlap the gate line 103 to form a storage capacitor StgC. Alternatively, the connection portion 153 may overlap the common line 106 to form a storage capacitor. Even though not shown in the drawings, a gate pad may be formed at an end of the gate line 103, and a data pad may be formed at an end of the data line 135. The gate pad and the data pad may be connected to a driving circuit to be provided with a gate signal and a data signal.

Figure 7A:
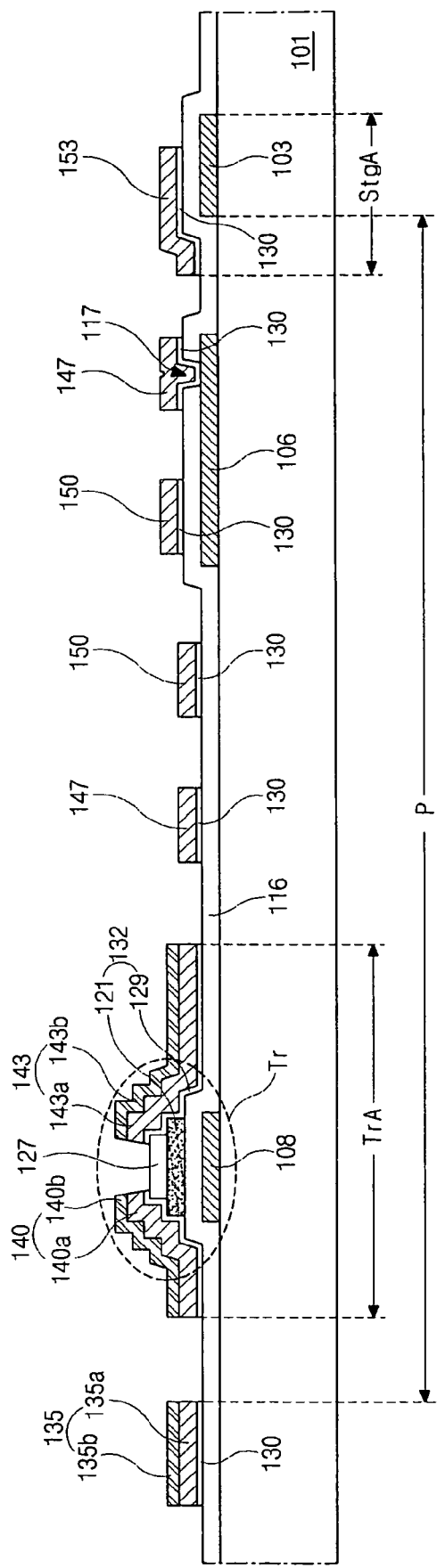
FIG. 7A is a cross-sectional view illustrating an array substrate of the IPS-LCD device, taken along a line VII-VII of FIG. 6, according to the first embodiment of the present invention.

FIG. 7A is a cross-sectional view illustrating an array substrate of the IPS-LCD device, taken along a line VII-VII of FIG. 6, according to the first embodiment of the present invention.

Referring to FIGS. 6 and 7A, the gate electrode 108 is formed in a switching region TrA on a substrate 101. A gate insulating layer 116 is formed on the substrate 101 having the gate electrode 108. An active layer 121 made of intrinsic amorphous silicon is formed on the gate insulating layer 116 and corresponds to the gate electrode 108. The active layer 121 may be within an outline of the gate electrode 108. An etch stopper 127 is formed on the active layer 121. The etch stopper 127 may expose both sides of the active layer 121 and be made of inorganic insulating material. Ohmic contact layers 129 may be formed on the etch-stopper 127, the active layer 121, and the gate insulating layer 116. The ohmic contact layers 129 may overlap both sides of the etch stopper 127 and cover the exposed portion of the active layer 121. The semiconductor layer 132 includes the active layer 121 and the ohmic contact layers 127.

Source and drain electrodes 140 and 143 are formed on the ohmic contact layers 127. The source and drain electrodes 140 and 143 may have at least two layers, for example double layers.

The gate line 103 may be formed of the same material as a common line 106. The gate insulating layer 116 is formed on the gate line 103 and the common line 106. The gate insulating layer 116 may have a plurality of common contact holes 117 exposing the common line 106.

A plurality of pixel electrodes 150 and a plurality of common electrodes 147 are formed on the gate insulating layer 116. The pixel electrodes 150 may be formed of the same material as the common electrodes 147. The pixel electrodes 150 are connected to the drain electrode 143, and the common electrodes 147 are connected to the common line 106 through the common contact holes 117. Impurity-doped amorphous silicon patterns 130 may be formed below and along the pixel electrodes 150 and the common electrodes 147. The impurity-doped amorphous silicon pattern 130 may substantially have the same shape in plane as the pixel electrode 150 or the common electrode 147 on the impurity-doped amorphous silicon pattern 130. The impurity-doped amorphous silicon pattern 130 may be formed below and along the data line 135 and substantially have the same shape in plane as the data line 135.

In a storage region StgA, a storage capacitor StgC may be formed. The storage capacitor StgC may include a first storage electrode of a portion of a gate line 103 and a second storage electrode of the connection portion 153 overlapping the gate line 103, and the gate insulating layer 116 is located between the first and second storage electrodes. The impurity-doped amorphous silicon pattern 130 may be formed below and along the connection portion 153 and substantially have the same shape in plane as the connection portion 153.

Figure 8A:
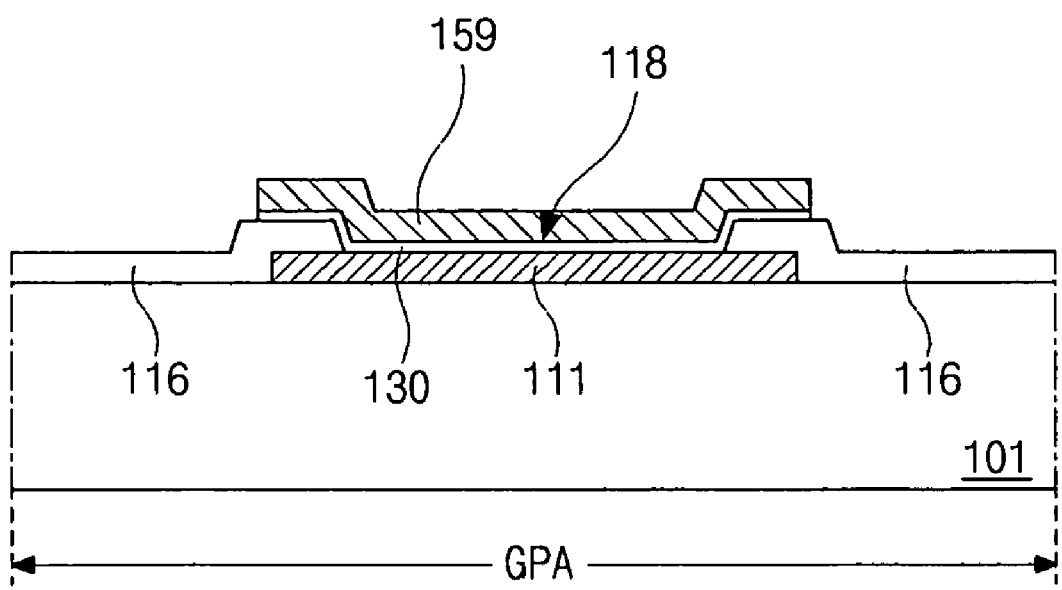
FIGS. 8A and 9A are cross-sectional views illustrating a gate pad and a data pad, respectively, of the array substrate of the IPS-LCD device according to the first embodiment of the present invention.
Figure 9A:
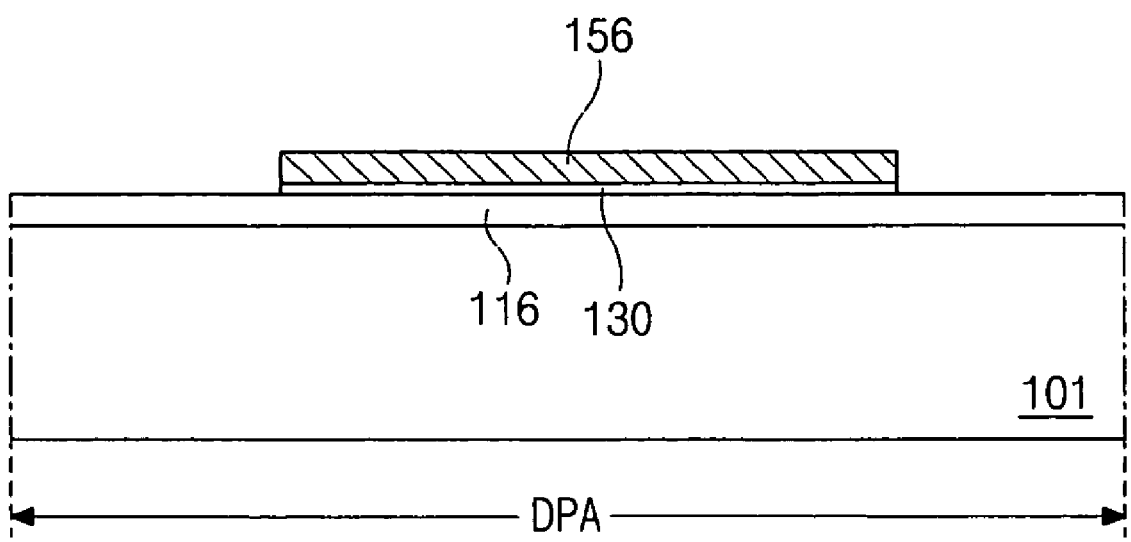

FIGS. 8A and 9A are cross-sectional views illustrating a gate pad and a data pad, respectively, of the array substrate of the IPS-LCD device according to the first embodiment of the present invention.

Referring to FIGS. 8A and 9A, a gate pad electrode 111 is formed on a substrate 101 in a gate pad region GPA. The gate pad electrode 111 may be located at an end of the gate line (103 of FIGS. 6 and 7A). A gate insulating layer 116 may have a gate pad contact hole 118 exposing the gate pad electrode 111. A gate pad terminal electrode 159 is electrically connected to the gate pad electrode 111 through the gate pad contact hole 118. An impurity-doped amorphous silicon pattern 130 may be below the gate pad terminal electrode 159 and substantially have the same shape in plane as the gate pad terminal electrode 159.

A data pad electrode 156 is formed on the gate insulating layer 116 in a data pad region DPA. The data pad electrode 156 may be located at an end of the data line (135 of FIGS. 6 and 7A). The impurity-doped amorphous silicon pattern 130 may be below the data pad electrode 156 and substantially have the same shape in plane as the data pad electrode 156.

Referring to FIGS. 7A, 8A and 9A, in the array substrate of the first example of the embodiment, the pixel electrode 150, the common electrode 147, the common line 153, the gate pad terminal electrode 159 and the data pad electrode 156 may have a single-layered structure, and the impurity-doped amorphous silicon patterns 130 may be formed below the pixel electrode 150, the common electrode 147, the connection portion 153, the gate pad terminal electrode 159 and the data pad electrode 156. The source and drain electrodes 140 and 143 and the data line 135 may have a double-layered structure. For example, the source electrode 140 may have first and second layers 140a and 140b, the drain electrode 143 may have first and second layers 143a and 143b, and the data line 135 may have first and second layers 135a and 135b. The second layers 140b, 143b and 135b of the source electrode 140, the drain electrodes 143 and the data line 135 may be formed of a low resistance material including copper (Cu), copper alloy, aluminum (Al) and aluminum alloy. Accordingly, voltage drop of data signals supplied along the data lines 135 to pixels can be minimized. The pixel electrode 150, the common electrode 147, the connection portion 153, the gate pad terminal electrode 159, the data pad electrode 156, and the first layers 140a, 143a and 135a of the source electrode 140, the drain electrodes 143 and the data line 135 may be formed of a metal material including molybdenum (Mo) and molybdenum alloy.

The low resistance material may be subject to corrosion. Accordingly, for the gate pad and the data pad, metal layers made of the low resistance material may be removed, and the gate pad terminal electrode 159 and the data pad electrode 156 may not have a layer made of the low resistance material. Further, the pixel electrode 150 and the common electrode 147 may not have a layer made of the low resistance material so that a step between the pixel and common electrodes 150 and 147 and the gate insulating layer 116 can be minimized.

Figure 8B:
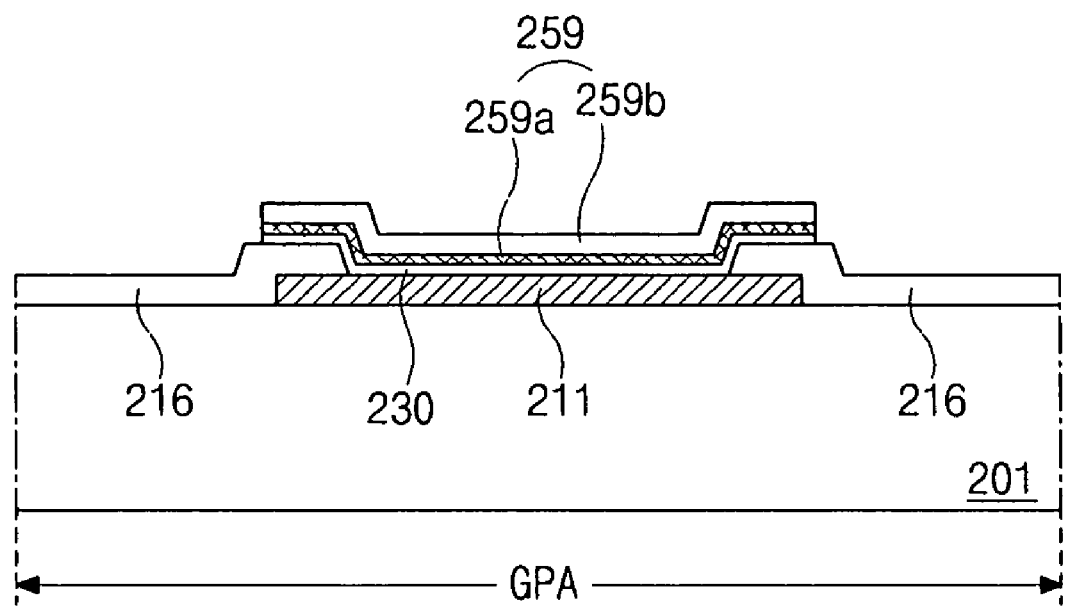
Figure 9B:
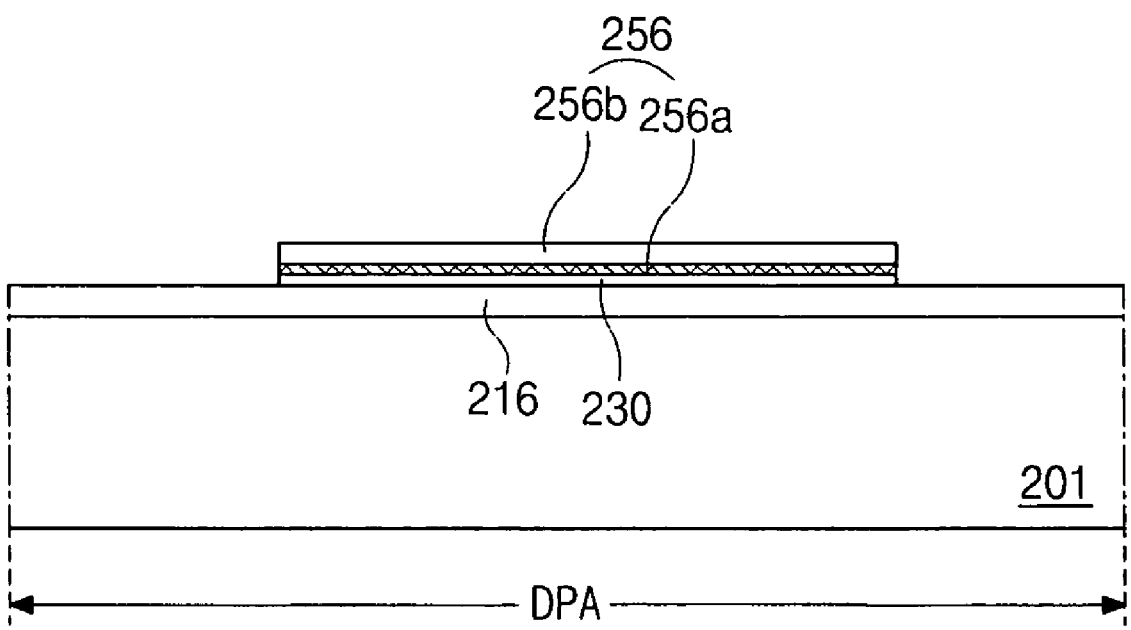

FIGS. 7B, 8B and 9B are cross-sectional views illustrating an array substrate according to a second embodiment of the present invention. FIGS. 7B, 8B and 9B correspond to FIGS. 7A, 8A and 9A, respectively. The array substrate of FIGS. 7B, 8B and 9B is similar to that of FIGS. 7A, 8A and 9A, except for a layered structure of the source and drain electrodes, the data line, the pixel and common electrodes, the common line, the connection portion, the gate pad terminal electrode and the data pad electrode. Explanations of parts similar to parts of FIGS. 7A, 8A and 9A may be omitted.

The source and drain electrodes 240 and 243 and the data line 235 may have a triple-layered structure, and the pixel and common electrodes 250 and 247, the connection portion 253, the gate pad terminal electrode 259 and the data pad electrode 256 may have a double-layered structure.

First layers 240a, 243a, 235a, 250a, 247a, 253a, 259a and 256a of the source electrode 240, the drain electrode 243, the data line 235, the pixel electrode 250, the common electrode 247, the connection portion 253, the gate pad terminal electrode 259 and the data pad electrode 256 may have a thickness of about 30 to 60 Å and be formed of a metal material such as molybdenum (Mo) and molybdenum alloy. Second layers 240b, 243b, 235b, 250b, 247b, 253b, 259b and 256b of the source electrode 240, the drain electrode 243, the data line 235, the pixel electrode 250, the connection portion 247, the common line 253, the gate pad terminal electrode 259 and the data pad electrode 256 may be formed of a transparent conductive material such as indium-tin-oxide (ITO), indium-zinc-oxide (IZO) and indium-tin-zinc-oxide (ITZO). Third layers 240c, 243c and 235c of the source electrode 240, the drain electrode 243 and the data line 235 may be formed of a low resistance material such as copper (Cu), copper alloy, aluminum (Al), aluminum alloy.

For the gate pad and the data pad, metal layers made of the low resistance material may be removed, and the gate pad terminal electrode 159 and the data pad electrode 156 may have top layers formed of the transparent conductive material resistant to corrosion. Accordingly, the pads can be prevented from corrosion.

Explanations to a method of fabricating the IPS-LCD device according to the embodiments of the present invention will be made as follows. As described above, since the array substrate of the first embodiment is similar to that of the second embodiment except for the layered structure, the explanations to the method of fabricating the IPS-LCD device according to the first and second embodiments will be made together.

FIGS. 10A to 10K are cross-sectional views illustrating fabrication processes of a portion, taken along a line VII-VII of FIG. 6, of the array substrate of the IPS-LCD device according to the first embodiment of the present invention, FIGS. 11A to 11K are cross-sectional views illustrating fabrication processes of a gate pad portion of the array substrate of the IPS-LCD device according to the first embodiment of the present invention, and FIGS. 12A to 12K are cross-sectional views illustrating fabrication processes of a data pad portion of the array substrate of the IPS-LCD device according to the first embodiment of the present invention.

Figure 10B:
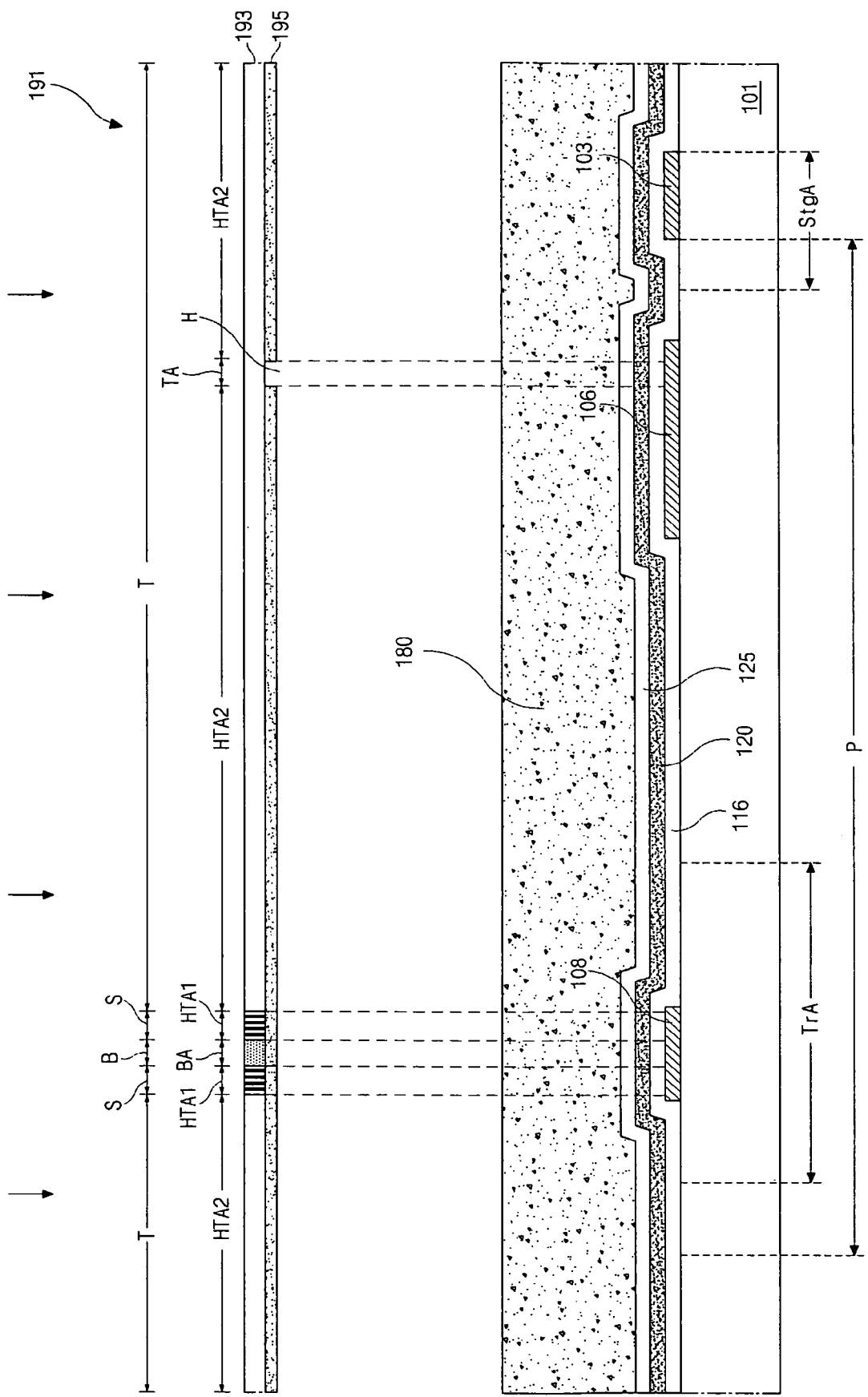
Figure 11A:
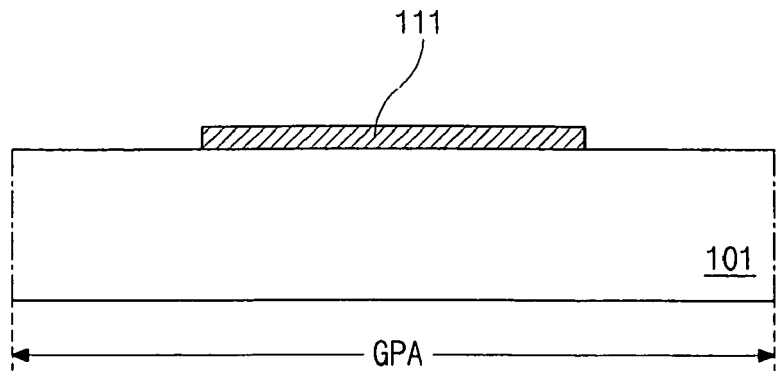
Figure 12A:
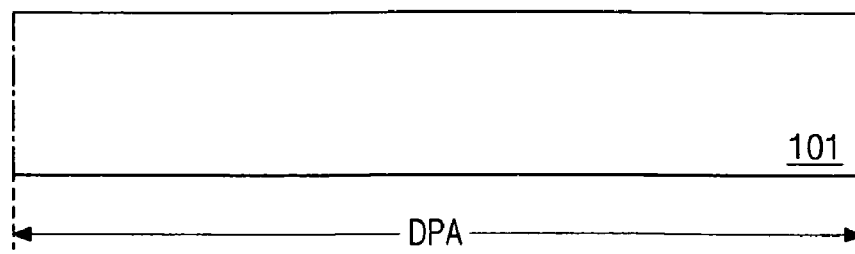
FIGS. 12A to 12K are cross-sectional views illustrating fabrication processes of a data pad portion of the array substrate of the IPS-LCD device according to the first embodiment of the present invention.

Referring to FIGS. 10A, 11A and 12A, a first metal material is deposited on a substrate 101 and patterned with a first mask (not shown) to form a gate line 103, a common line 106, a gate electrode 108 and a gate pad electrode 111. The gate electrode 108 is formed in a switching region TrA, and the gate pad electrode 111 is formed in a gate pad region GPA. The first metal material may include copper (Cu), copper alloy, aluminum (Al), aluminum alloy and chromium (Cr).

Figure 11B:
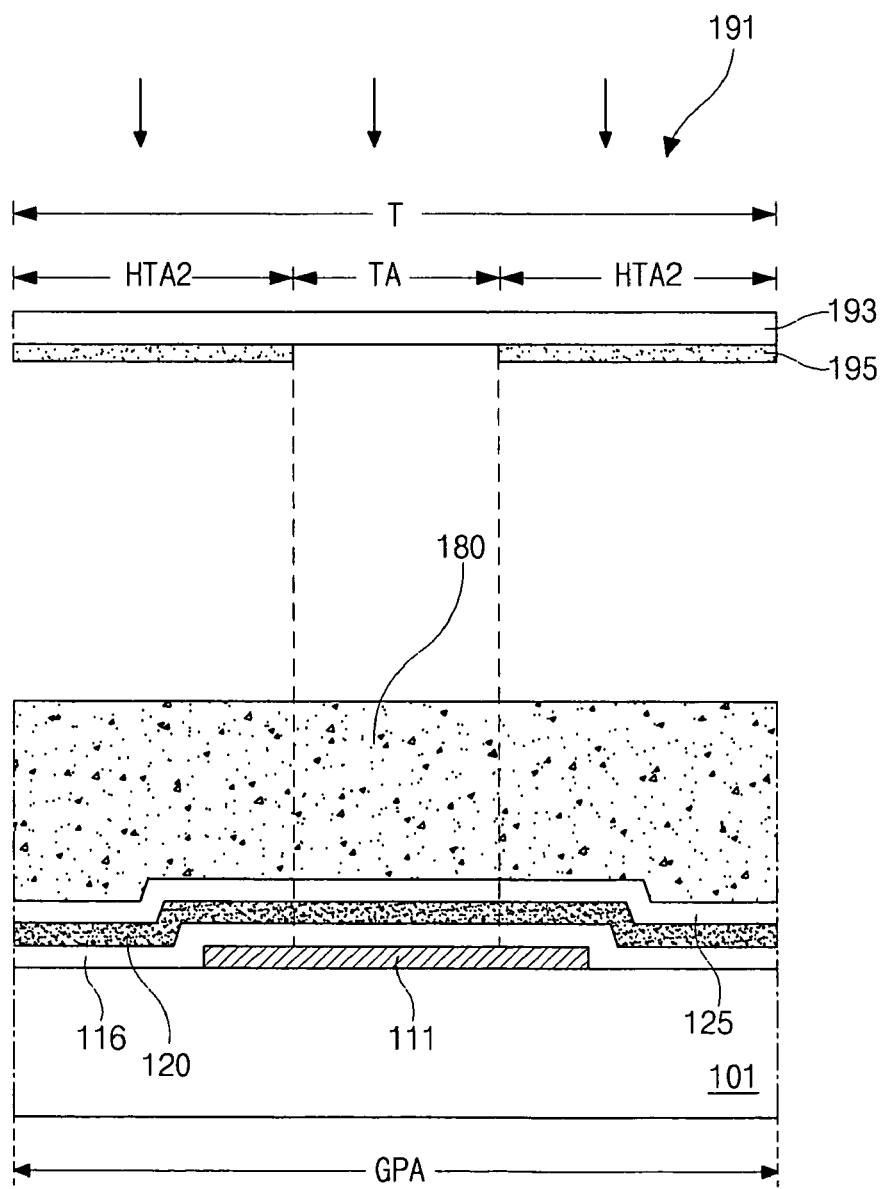
Figure 12B:
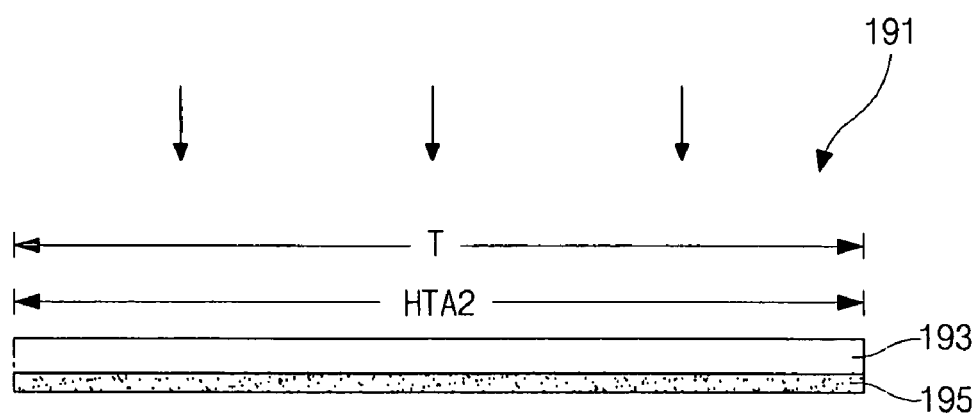
Figure 12B:
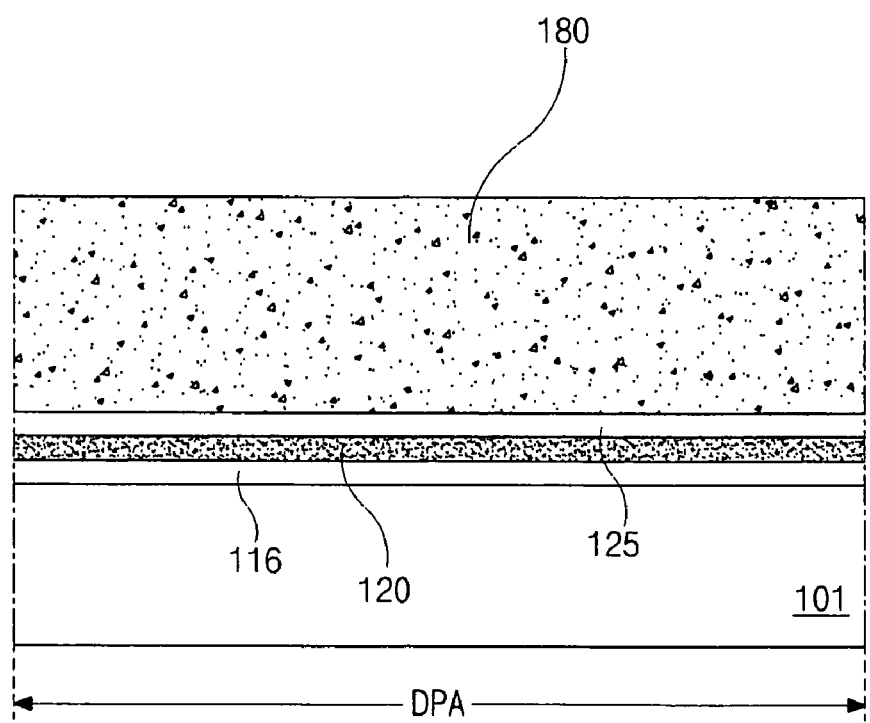

Referring to FIGS. 10B, 11B and 12B, a gate insulating layer 116, an intrinsic amorphous silicon layer 120 and a first insulating layer 125 are sequentially formed on the substrate 101 having the gate line 103. The gate insulating layer 116 may be formed of at least one of silicon nitride and silicon oxide. The first insulating layer 125 may formed of at least one of silicon nitride and silicon oxide.

A first photoresist layer 180 is formed on the first insulating layer 125. The first photoresist layer 180 may be positive type. A second mask 191 is located over the first photoresist layer 180 and has a blocking portion BA, first and second semi-transmissive portions HTA1 and HTA2 and a transmissive portion TA. A light exposure is performed for the first photoresist layer 180 with the second mask 191. Light transmissivities through the first and second semi-transmissive portions HTA1 and HTA2 are between that through the blocking portion BA and that through the transmissive portion TA, and the light transmissivity through the first semi-transmissive portion HTA1 is less than that through the second semi-transmissive portion HTA2.

The second mask 191 may have a base substrate 193 and a semi-transmissive layer 195 on a surface of the base substrate 193. The base substrate 193 may have a blocking area B and a semi-transmissive area S and a transmissive area T. The blocking area B corresponds to the blocking portion BA, the semi-transmissive area S corresponds to the first semi-transmissive portion HTA1, and the transmissive area T corresponds to the second semi-transmissive portion HTA2 and the transmissive portion TA. The blocking area B may include a metal film to block light, and the semi-transmissive area S may include slit patterns to semi-transmit light. The transmissive area T is transparent to transmit light. The semi-transmissive layer 195 may correspond to the first and second semi-transmissive portions HTA1 and HTA2. Further, the semi-transmissive layer 195 may be formed corresponding to the blocking portion BA. The semi-transmissive layer 195 has a through hole H corresponding to the transmissive portion TA to transmit light.

The semi-transmissive layer 195 may include a half-tone film to semi-transmit light. Light passing through the first semi-transmissive portion HTA1 is doubly semi-transmitted while light passing through the second semi-transmissive portion HTA2 is singly semi-transmitted. Accordingly, the light transmissivity through the first semi-transmissive portion HTA1 is less than that through the second semi-transmissive portion HTA2. It should be understood that the second mask 191 may be formed in various manners other than shown in FIGS. 10B, 11B and 12B.

When the negative type photoresist layer 183 is used, the blocking portion BA changes positions with the transmissive portion TA and the first semi-transmissive portion HTA1 changes positions with the second semi-transmissive portion HTA2.

Figure 11C:
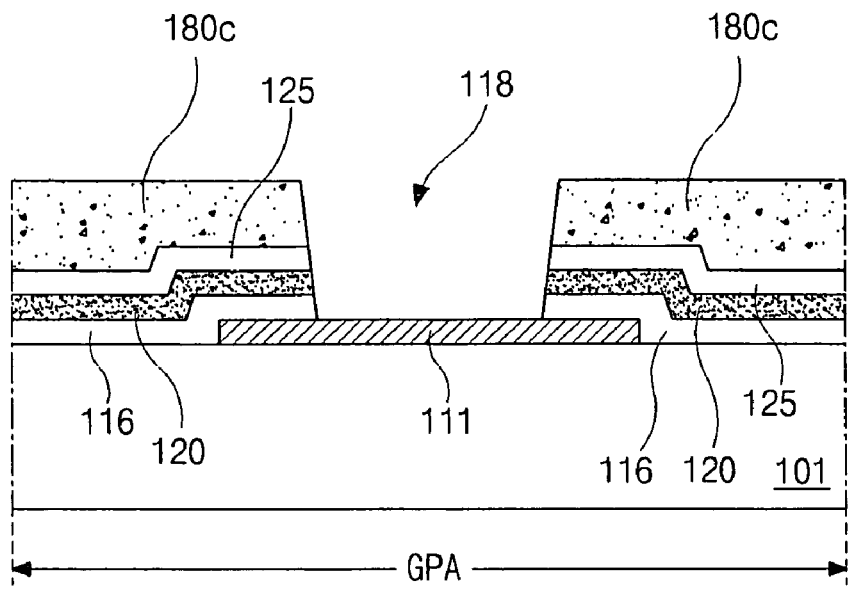
Figure 12C:
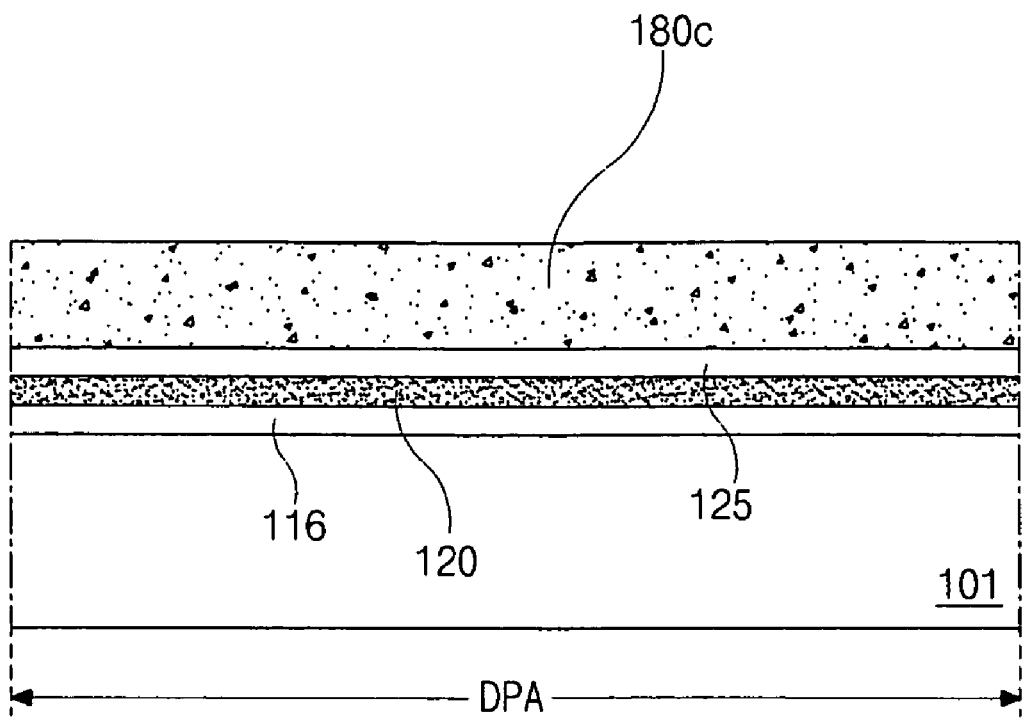

Referring to FIGS. 10C, 11C and 12C, through the light exposure, the first photoresist layer (180 of FIGS. 10B, 11B and 12B) is developed. The developed first photoresist layer includes a first photoresist portion 180a having a first thickness, a second photoresist portion 180b having a second thickness and a third photoresist portion 180c having a third thickness. The first photoresist portion 180a corresponds to the blocking portion (BA of FIG. 10B), the second photoresist portion 180b corresponds to the first semi-transmissive portion (HTA1 of FIG. 10B), and the third photoresist portion 180c corresponds to the second semi-transmissive portion (HTA2 of FIGS. 10B, 11B and 12B). The removed portion of the first photoresist layer corresponds to the transmissive portion (TA of FIGS. 10B and 11B).

The first photoresist portion 180a and the second photoresist portion 180b are formed in the switching region TrA, and the two second photoresist portions 180b are located at both sides of the first photoresist portions 180a. Since the second photoresist portion 180b is exposed to light more than the first photoresist portion 180a when the first photoresist layer is positive type, the first thickness is more than the second thickness. The first thickness is substantially the same as an initial thickness of the first photoresist layer.

The removed portion is formed over at least a portion of the common line 106 and at least a portion of the gate pad electrode 111. The third photoresist portion 180c may be formed in a region except for regions of the first and second photoresist portions 180a and 180b and the removed portion among a pixel region P, a region except for a region of the removed portion among the gate pad region GPA, and a data pad region DPA. Since the third photoresist portion 180c is exposed to light more than the second photoresist portion 180b when the photoresist layer is positive type, the second thickness is more than the third thickness.

An etching process is performed for the first insulating layer 125, the intrinsic amorphous silicon layer 120 and the gate insulating layer 116 using the developed first photoresist layer to form a common contact hole 117 and a gate pad contact hole 118. The common contact hole 117 and the gate pad contact hole 118 correspond to the removed portion.

Figure 11D:
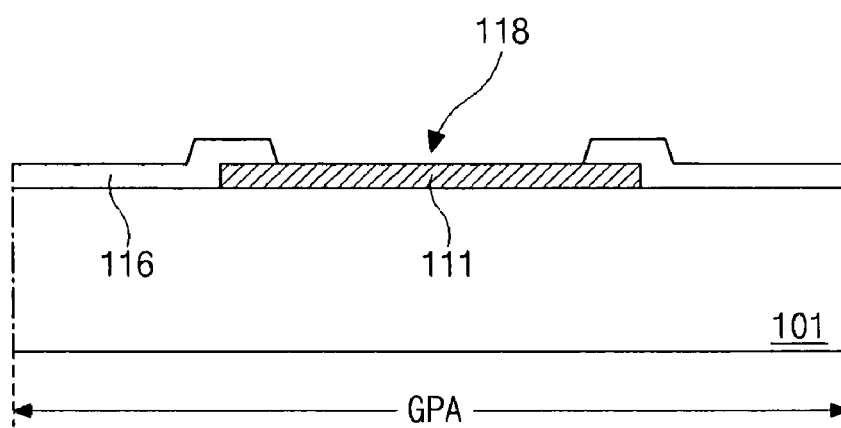
Figure 12D:
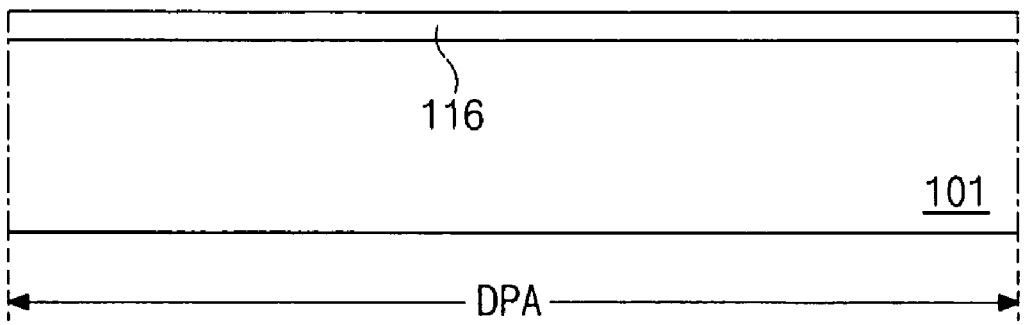

Then, referring to FIGS. 10D, 11D and 12D, a first ashing process is performed for the developed first photoresist layer until the third photoresist portion (180c of FIGS. 10C, 11C and 12C) is completely removed. During the first ashing process, the first and second photoresist portions 180a and 180b are partially removed so that thicknesses of the first and second photoresist portions 180a and 180b are reduced. Through the first ashing process, the first-ashed first photoresist layer having the first-ashed first and second photoresist portions 180a and 180b remains, and the first insulating layer (125 of FIGS. 10C, 10C and 12C) below the third photoresist portion is exposed. Then, the first insulating layer and the intrinsic amorphous silicon layer (120 of FIGS. 10C, 11C and 12C) below the third photoresist portion are removed by an etching process, for example, a dry-etching process. After the etching process, the first insulating layer and the intrinsic amorphous silicon layer below the first-ashed first and second portions 180a and 180b remain. The remaining amorphous silicon layer is referred to as an active layer 121, and the remaining first insulating layer is referred to as a first insulating pattern 126.

Figure 11E:
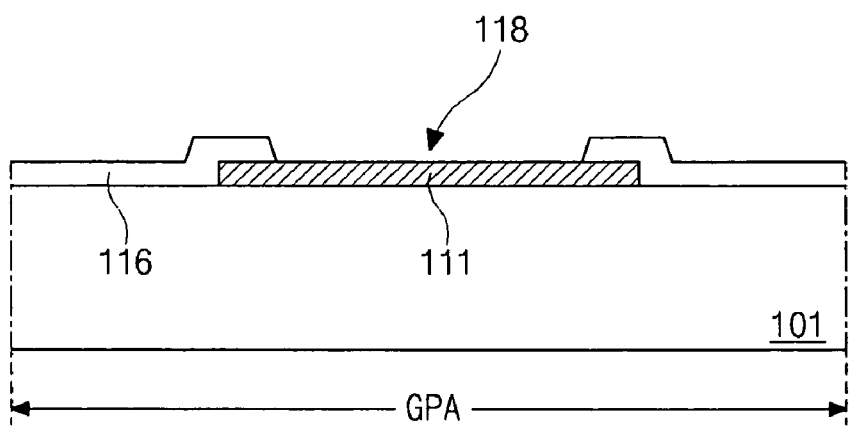
Figure 12E:
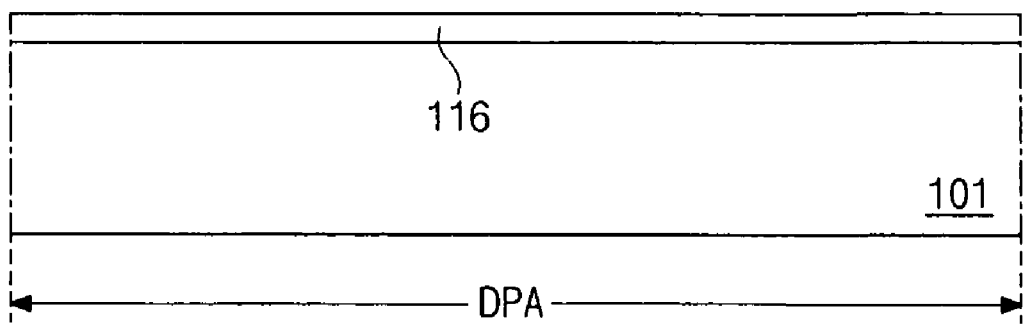

Referring to FIGS. 10E, 11E and 12E, a second ashing process is performed for the first-ashed first photoresist layer until the first-ashed second photoresist portion (180b of FIG. 10D) is completely removed. During the second ashing process, the first-ashed first photoresist portion 180a is partially removed so that the thickness of the first photoresist portion 180a is further reduced. Through the second ashing process, the second-ashed first photoresist portion 180a remains, and the first insulating pattern (126 of FIG. 10D) below the first-ashed second photoresist portion is exposed. Then, the first insulating pattern 126 is removed by an etching process, for example, a dry-etching process. After the etching process, the first insulating pattern below the second-ashed first photoresist portion 180a remains, and both side portions of the active layer 121 are exposed. The remaining first insulating pattern is referred to as an etch stopper 127. Then, the second-ashed first photoresist layer is removed, for example, through an ashing process or stripping process.

Figure 11F:
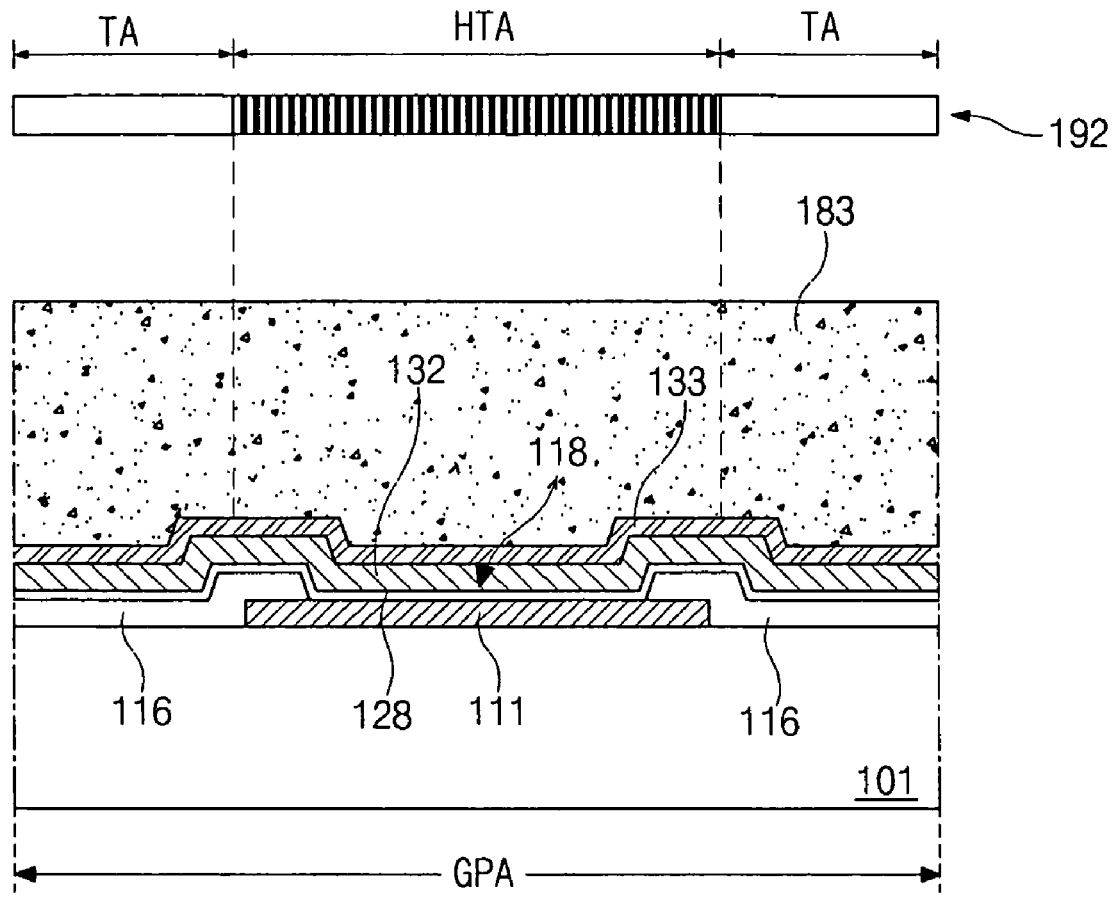
Figure 12F:
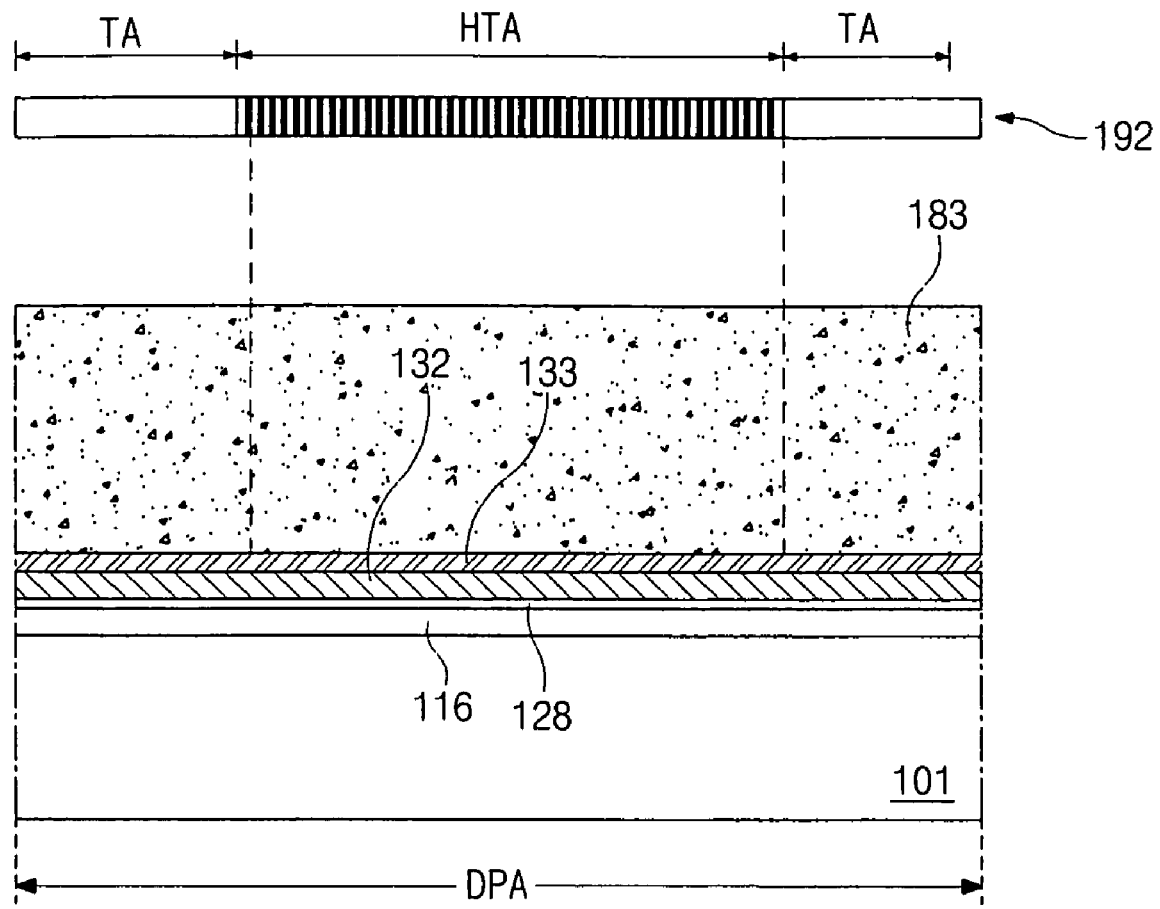

Referring to FIGS. 10F, 11F and 12F, an impurity-doped amorphous silicon layer 128, a second metal layer 132 and a third metal layer 133 are sequentially formed. The second metal layer 132 may be formed of at least one of molybdenum (Mo) and molybdenum alloy. The third metal layer 133 may be formed of a low resistance material including copper (Cu), copper alloy, aluminum (Al) and aluminum alloy.

Even though not shown in the drawings, when the array substrate of the IPS-LCD device according to the second embodiment is fabricated, a fourth metal layer is formed on the third metal layer 133. For this structure, the third metal layer may be formed of a transparent conductive material including indium-tin-oxide (ITO), indium-zinc-oxide (IZO) and indium-tin-zinc-oxide (ITZO), and the fourth metal layer may be formed of a low resistance material including copper (Cu), copper alloy, aluminum (Al) and aluminum alloy.

A second photoresist layer 183 is formed on the third metal layer 133 of the first embodiment or the fourth metal layer of the second embodiment. The second photoresist layer 183 is exposed to light using a third mask 192 including a blocking portion BA, a semi-transmissive portion HTA and a transmissive portion TA. Light transmissivity through the semi-transmissive portion HTA is between that through the blocking portion BA and that through the transmissive portion TA. The second photoresist layer 183 may be positive type. Alternatively, the photoresist layer 183 may be negative type, and when the negative type photoresist layer 183 is used, the blocking portion BA changes positions with the transmissive portion TA.

Figure 10G:
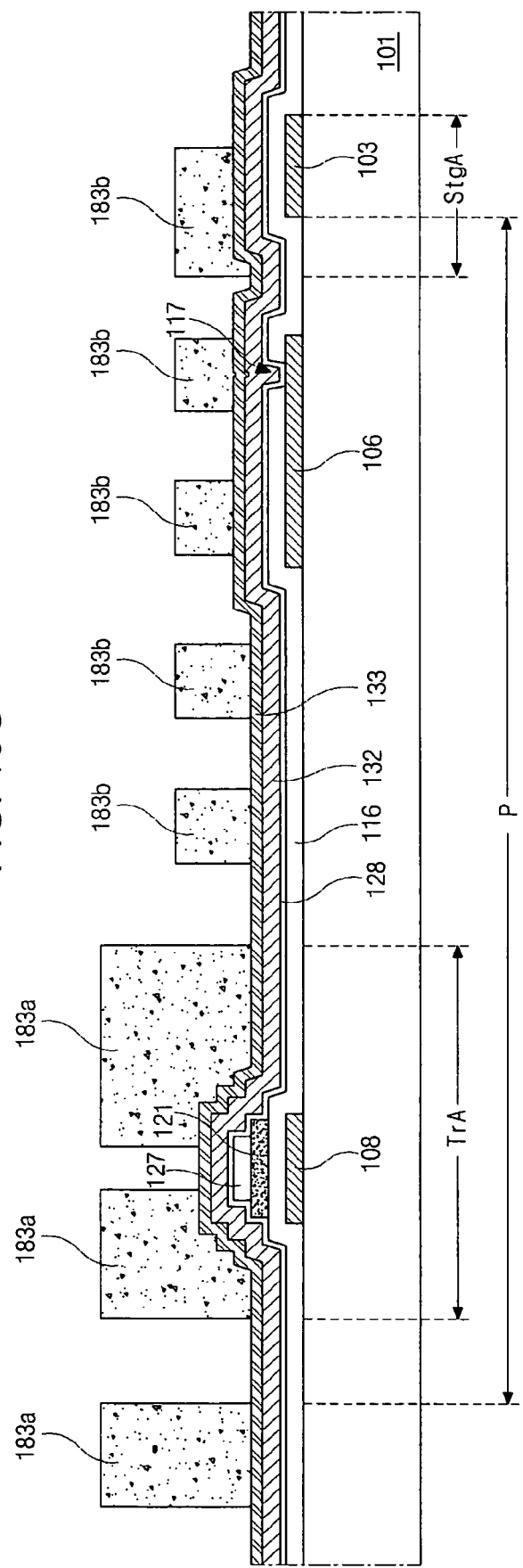
Figure 11G:
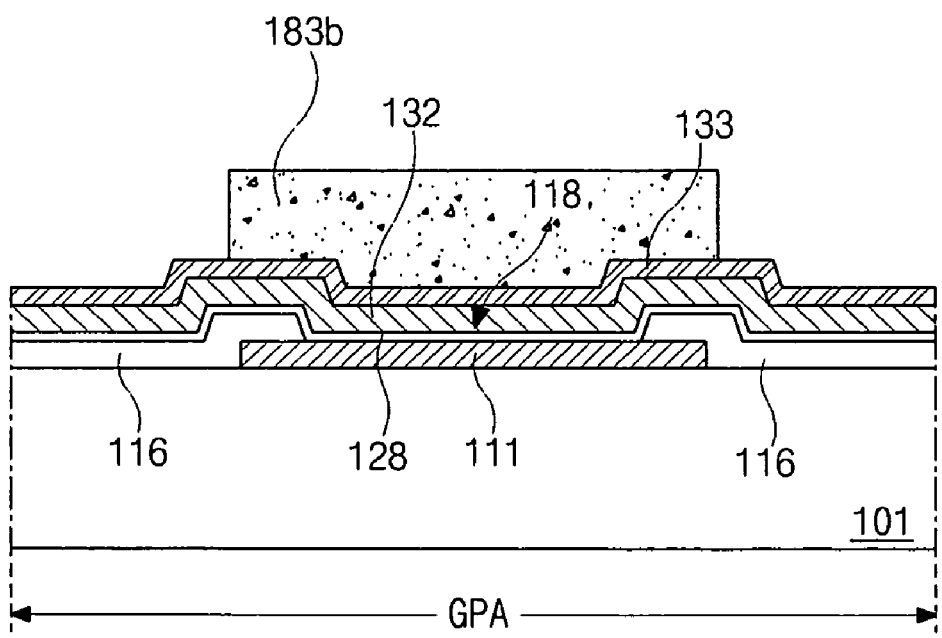
Figure 12G:
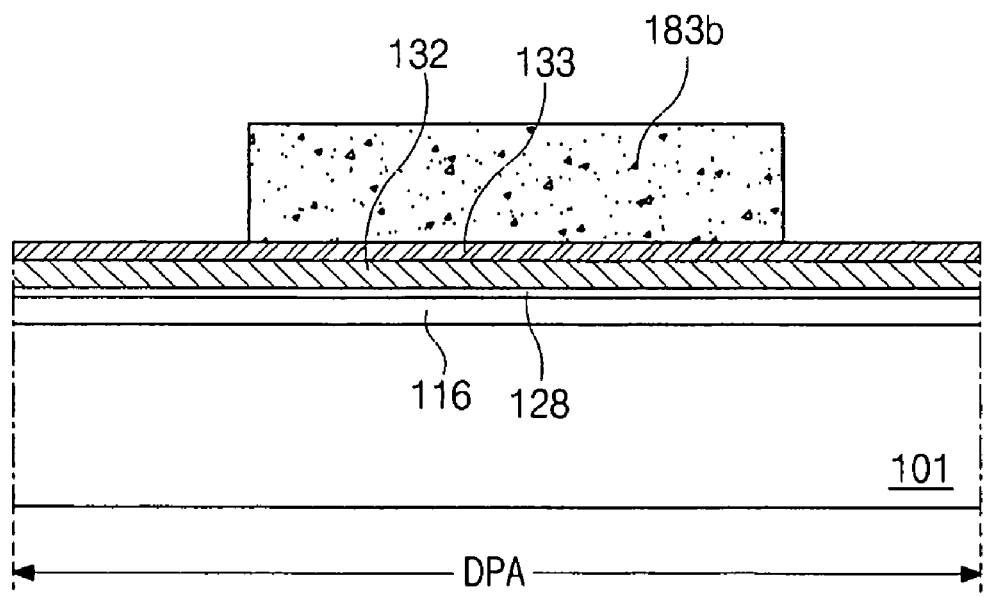

Referring to FIGS. 10G, 11G and 12G, through the light exposure, the second photoresist layer (183 of FIGS. 10F, 11F and 12F) is developed. The developed second photoresist layer includes a fourth photoresist portion 183a having a fourth thickness and a fifth photoresist portion 183b having a fifth thickness. The fourth photoresist portion 183a corresponds to the blocking portion (BA of FIG. 10F), and the fifth photoresist portion 183b corresponds to the semi-transmissive portion (HTA of FIG. 10F, 11F and 12F). The removed portion of the second photoresist layer corresponds to the transmissive portion (TA of FIGS. 10F, 11F and 12F).

The fourth photoresist portion 183a is formed in regions where source and drain electrodes and a data line are formed. The fifth photoresist portion 183b is formed in a storage region StgA, where a connection portion is formed, and regions where pixel electrodes, common electrodes, a gate pad terminal electrode and a data pad electrode are formed. Since the fifth photoresist portion 183b is exposed to light more than the fourth photoresist portion 183a when the photoresist layer is positive type, the fourth thickness is more than the fifth thickness. The fourth thickness is substantially the same as an initial thickness of the second photoresist layer.

The removed portion of the second photoresist layer may be formed in a region except for regions of the fourth and fifth photoresist portions 183a and 183b among the pixel region P, a region except for a region of the fifth photoresist portion 183b among the gate pad region GPA, and a region except for a region of the fifth photoresist portion 183b among the data pad region DPA.

Figure 10H:
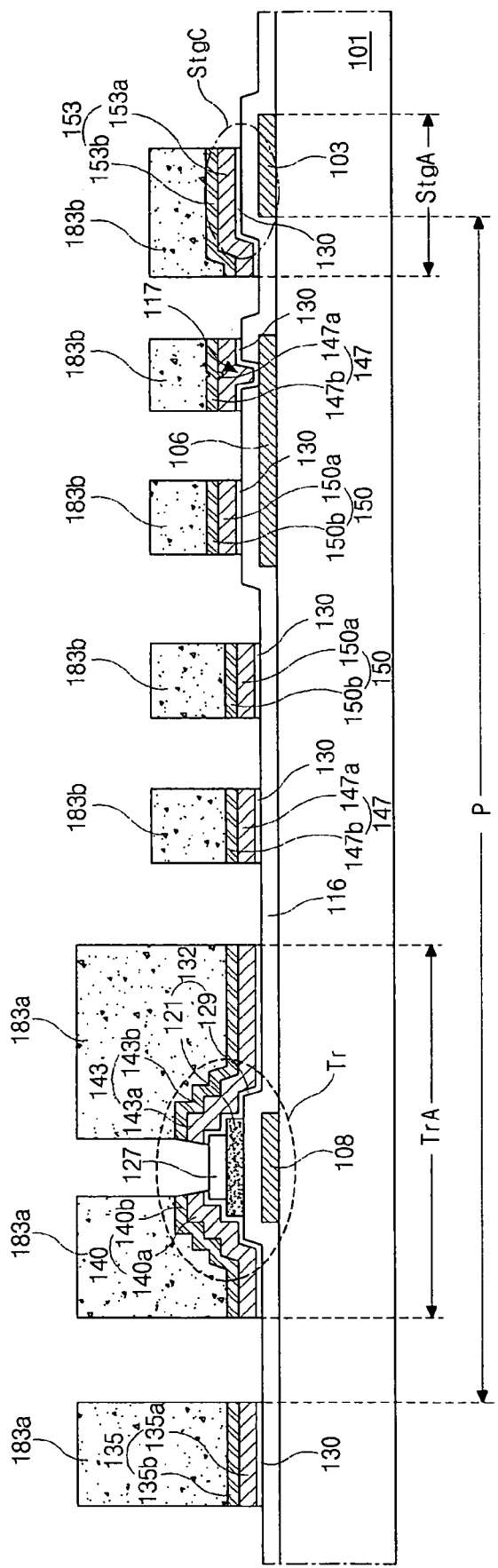
Figure 11H:
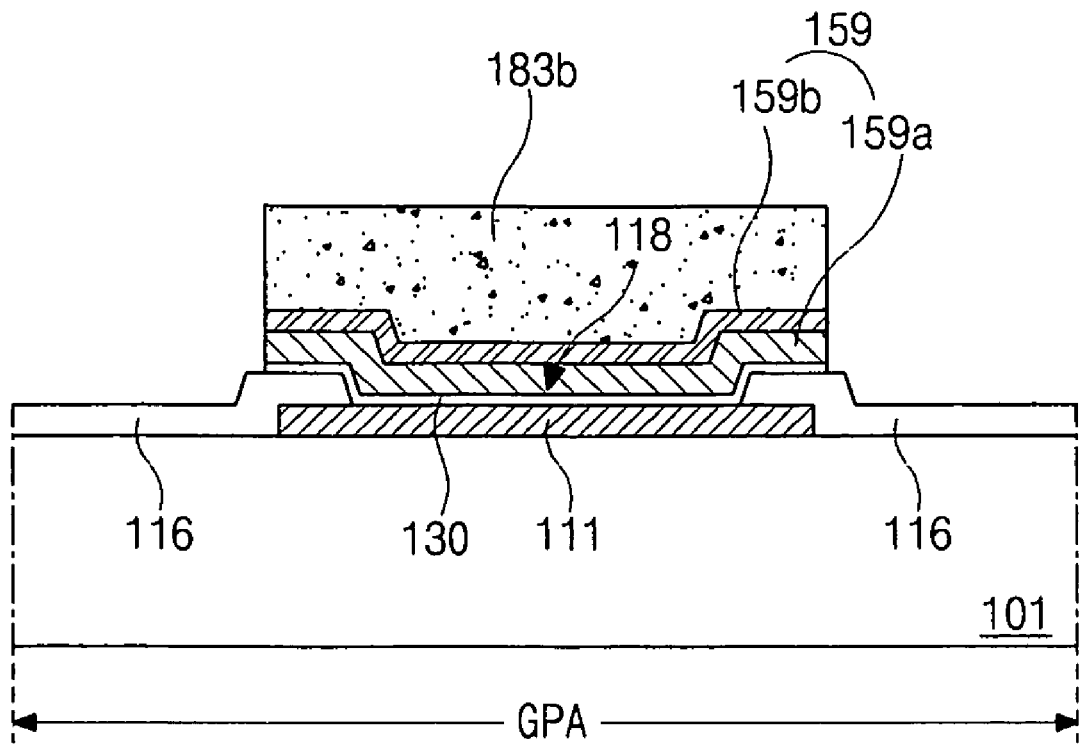
Figure 11I:
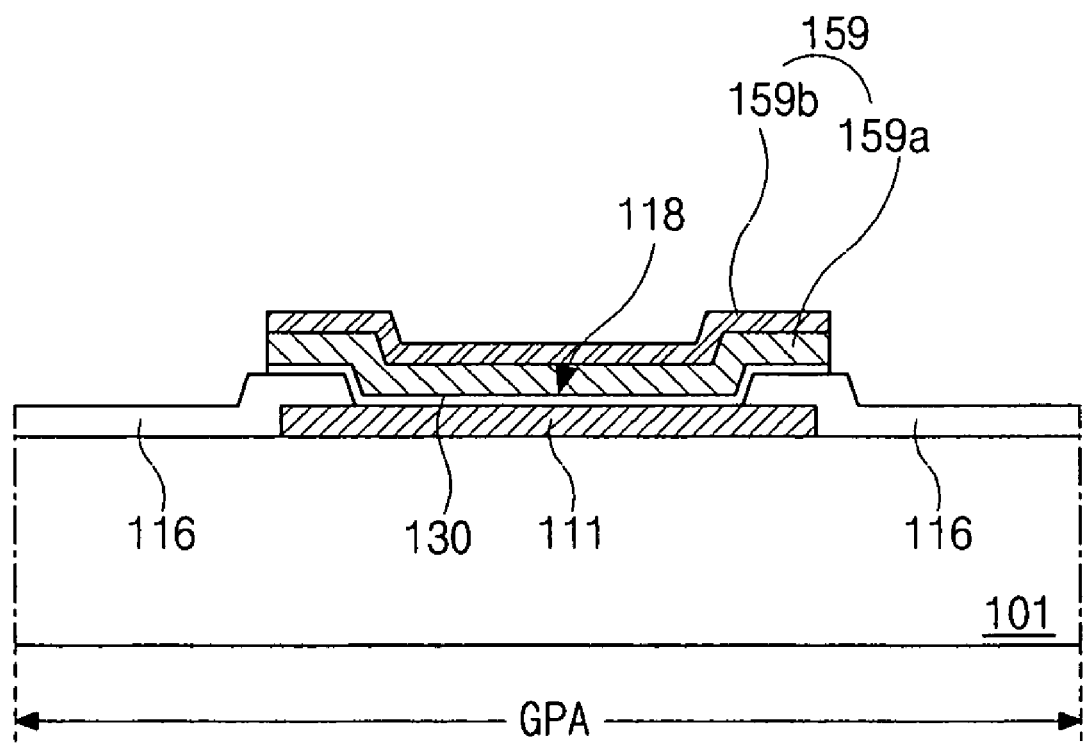
Figure 12H:
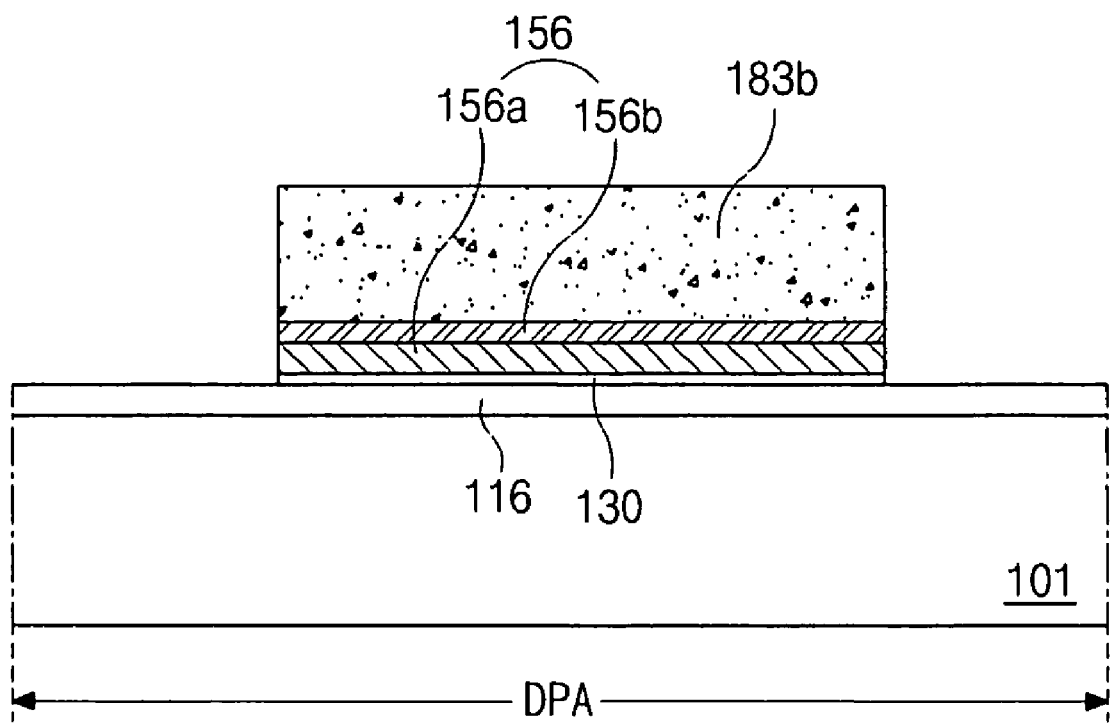
Figure 12I:
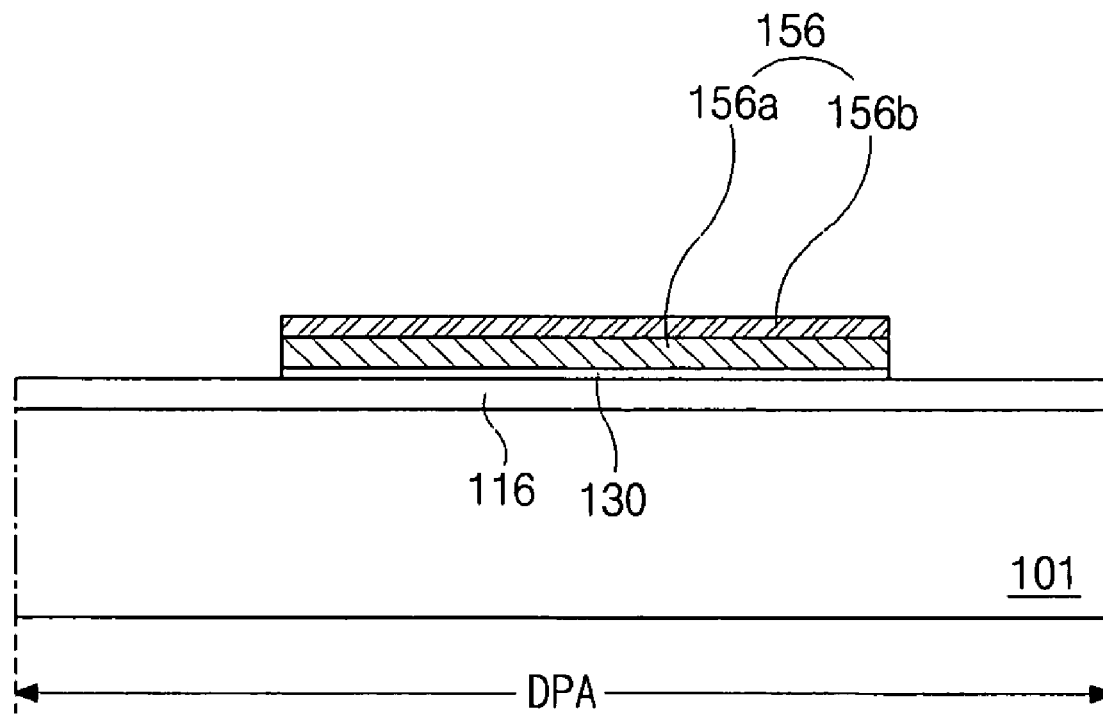

Referring to FIGS. 10H, 11H and 12H, an etching process is performed for the third metal layer (133 of FIGS. 10G, 11G and 12G), the second metal layer (132 of FIGS. 10G, 11G and 12G) and the impurity-doped amorphous silicon layer (128 of FIGS. 10G, 11G and 12G) using the developed second photoresist layer. Through the etching process, ohmic contact layers 129 spaced apart from each other are formed in the switching region TrA. Inner sides of both the ohmic contact layers 129 may face each other on the etch stopper 127. Further, source and drain electrodes 140 and 143 spaced apart from each other are formed, and a data line 135 crossing the gate line 103 to define the pixel region P is formed. The source electrode 140 includes first and second layers 140a and 140b formed of the second and third metal materials, respectively.

The drain electrode 143 include first and second layers 143a and 143b formed of the second and third metal materials, respectively. The data line 135 includes first and second layers 135a and 135b formed of the second and third metal materials, respectively. For the array substrate of the IPS-LCD device according to the second embodiment, the source and drain electrodes (240 and 243 of FIG. 7B) and the data line (235 of FIG. 7B) have triple-layered structure, as described above.

Further, metal patterns are formed. In other words, pixel electrodes 150 and common electrodes 147 are formed in the pixel region P, a connection portion 153 is formed in a storage region StgA, a gate pad terminal electrode 159 is formed in the gate pad region GPA, and a data pad electrode 156 is formed in the data pad region DPA. The pixel electrode 150 includes first and second layers 150a and 150b formed of the second and third metal materials, respectively. The common electrode 147 includes first and second layers 147a and 147b formed of the second and third metal materials, respectively. The connection portion 153 includes first and second layers 153a and 153b formed of the second and third metal materials, respectively. The gate pad terminal electrode 159 includes first and second layers 159a and 159b formed of the second and third metal materials, respectively. The data pad electrode 156 includes first and second layers 156a and 156b formed of the second and third metal materials, respectively. For the array substrate of the IPS-LCD device according to the second embodiment, the pixel electrode, the common electrode, the connection portion, the gate pad terminal electrode and the data pad electrode have triple-layered structures through the current etching process. Impurity-doped amorphous silicon patterns 130 are below the pixel electrode 150, the common electrode 147, the data line 135, the connection portion 153, the gate pad terminal electrode 159 and the data pad electrode 156. The impurity-doped amorphous silicon pattern 130 below the data line 135 is connected to the ohmic contact layer 129 below the source electrode 140. The common electrode 147 is electrically connected to the common line 106 through the impurity-doped amorphous silicon pattern 130 which contacts the common line 106 through the common contact hole 117. The gate pad terminal electrode 159 is electrically connected to the gate pad electrode 111 through the impurity-doped amorphous silicon pattern 130 which contacts the gate pad electrode 111 through the gate pad contact hole 118.

Figure 12J:
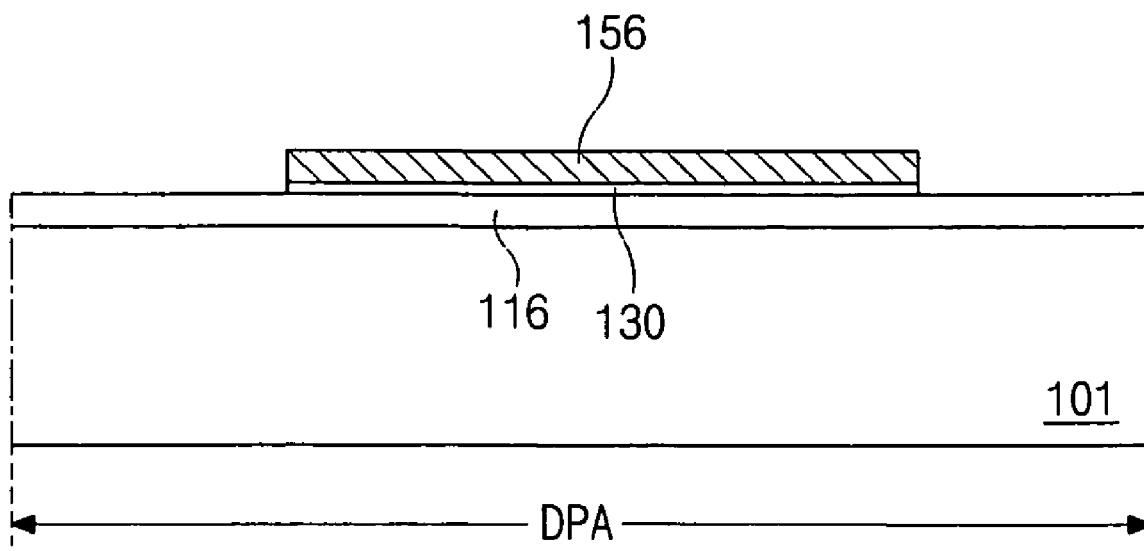

Referring to FIGS. 10J, 11J and 12J, an ashing process is performed for the developed second photoresist layer until the fifth photoresist portion (183b of FIGS. 10H, 11H and 12H) is completely removed. During the ashing process, the fourth photoresist portion 183a is partially removed so that the thickness of the fourth photoresist portion 183a is reduced. Through the ashing process, the ashed second photoresist layer having the ashed fourth photoresist portion 183a remains. Accordingly, the top layers of the pixel electrode 150, the common electrode 147, the connection portion 153, the gate pad terminal electrode 159 and the data pad electrode 156 are exposed while the source and drain electrodes 140 and 143 and the data line 135 are not exposed and the top surfaces thereof are covered by the first-ashed fourth photoresist portion 183a.

Referring to FIGS. 10J, 11J and 12J, a thermal treatment is performed for the ashed fourth photoresist portion (183a of FIGS. 10I, 11I and 12I) so that the ashed fourth photoresist portion reflows and completely covers the thin film transistor Tr and the data line 135. In other words, the reflowed fourth photoresist portion 183c completely covers the source and drain electrodes 140 and 143, the data line 135, the ohmic contact layers 129, the impurity-doped amorphous silicon pattern 130 below the data line 135 and the etch stopper 127.

Then, an etching process is performed to remove the second layers (150b, 147b, 153b, 159b and 156b of FIGS. 10I, 11I and 12I) of the pixel electrode 150, the common electrode 147, the connection portion 153, the gate pad terminal electrode 159 and the data pad electrode 156. Accordingly, the pixel electrode 150, the common electrode 147, the connection portion 153, the gate pad terminal electrode 159 and the data pad electrode 156 have a single-layered structure. For the array substrate of the IPS-LCD device according to the second embodiment, the third layers of the pixel electrode, the common electrode, the connection portion, the gate pad terminal electrode and the data pad electrode are removed, and the pixel electrode, the common electrode, the connection portion, the gate pad terminal electrode and the data pad electrode have a doubled-layered structure, as shown in FIGS. 7B, 8B and 9B.

Since the data line 135 and the impurity-doped amorphous silicon pattern 130 therebelow are completely covered by the reflowed fourth photoresist portion 183c, the data line 135 and the impurity-doped amorphous silicon pattern 130 therebelow are prevented from being etched and substantially have the same shape in plane. The intrinsic amorphous silicon pattern of the related art does not exist below the data line 135. Accordingly, wavy noise can be prevented and aperture ratio can increase. Further, since the source and drain electrodes 140 and 143 and the ohmic contact layer 129 therebelow are completely covered by the reflowed fourth portion 183c, they are prevented from being etched and have the same shape in plane. The active layer 121 is in the outline of the gate electrode 108, does not protrude outside the ohmic contact layer 129, and does not extend below the data line 135. Accordingly, photo current can be minimized and off current can be reduced.

Figure 12K:
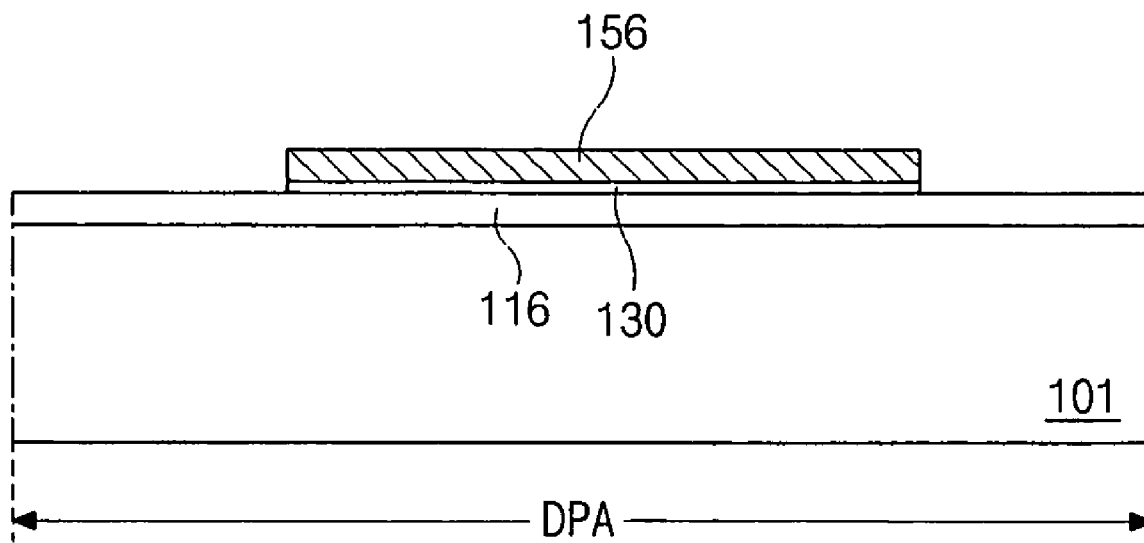

Referring to FIGS. 10K, 11K and 12K, the reflowed fourth portion (183c of FIG. 10K) are removed, for example, through an ashing process or stripping process.

Through the above-described processes, the array substrate of the IPS-LCD device according to the embodiments of the present invention is fabricated. Further, the array substrate is attached to an opposing substrate, for example, a color filter substrate so that the IPS-LCD device according to the embodiments of the present invention is fabricated.

In the above-described embodiments, the connection portion has the same layered structure as the pixel and common electrodes. Alternatively, the connection portion may have the same layered structure as the source and drain electrodes, and to do this, the connection portion may be formed in the same manner of forming the source and drain electrodes.

As described above, the array substrate of the IPS-LCD device according to the embodiments can be fabricated though three mask processes. Accordingly, the number of mask processes and production cost can be reduced. Further, the intrinsic amorphous silicon pattern does not formed below the data line. Accordingly, wavy noise can be prevented and aperture ratio can increase. Further, the active layer is in the outline of the gate electrode and does not protrude outside the ohmic contact layer. Accordingly, photo current can be minimized and off current can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:
    forming a gate line, a gate electrode, a gate pad electrode at an end of the gate line, and a common line on a substrate;
    forming a gate insulating layer on the gate electrode;
    forming an active layer on the gate insulating layer;
    forming an etch stopper on the active layer;
    forming first and second ohmic contact layers spaced apart from each other on the active layer and an impurity-doped amorphous silicon pattern contacting the gate insulating layer therebelow, outer sides of the first and second ohmic contact layers being outside the active layer;
    forming a data line crossing the gate line to define a pixel region, a data pad electrode at an end of the data line, and source and drain electrodes on the first and second ohmic contact layers, respectively;
    forming a pixel electrode and a common electrode in the pixel region to induce an in-plane electric field; and
    forming a gate pad terminal electrode on the gate pad electrode,
    wherein each of the data line, the pixel electrode and the common electrode contacts the impurity-doped amorphous silicon pattern therebelow.

2. The method according to claim 1, wherein at least one of the pixel electrode, the common electrode, the gate pad terminal electrode, and the data pad electrode have at least one layer, and wherein at least one of the data line and the source and drain electrodes have the at least one layer and another layer on the at least one layer.

3. The method according to claim 2, wherein forming the active layer and the etch stopper includes:
    sequentially depositing an intrinsic amorphous silicon layer, an insulating layer, and a first photoresist layer;
    exposing the first photoresist layer to light using a mask including a transmissive portion, first and second semi-transmissive portion and a blocking portion;
    developing the first photoresist layer to form first to third photoresist portions corresponding to the blocking portion, the first semi-transmissive portion and the second semi-transmissive portion, respectively, wherein the first photoresist portion is thicker than the second photoresist portion, and the second photoresist portion is thicker than the third photoresist portion, and wherein a portion of the first photoresist layer corresponding to the transmissive portion is removed;
    first-etching the insulating layer, the intrinsic amorphous silicon layer and the gate insulating layer using the developed first photoresist layer to form a common contact hole exposing the common line and a gate pad contact hole exposing the gate pad electrode;
    first-ashing the developed first photoresist layer to remove the third photoresist portion;
    second-etching the first-etched insulating layer and intrinsic amorphous silicon layer using the first-ashed first photoresist layer to form the active layer below the first-ashed first and second photoresist portions;
    second-ashing the first-ashed first photoresist layer to remove the first-ashed second photoresist portion;
    third-etching the second-etched insulating layer using the second-ashed first photoresist layer to form the etch stopper below the second-ashed first photoresist portion; and
    removing the second-ashed first photoresist portion,
    wherein the common electrode is electrically connected to the common line through the common contact hole, and the gate pad terminal electrode is electrically connected to the gate pad electrode through the gate pad contact hole.

4. The method according to claim 2, wherein forming the first and second ohmic contact layers, the impurity-doped amorphous silicon pattern, the source and drain electrodes, the data line, the pixel and common electrodes, the gate pad terminal electrode and the data pad electrode includes:
    sequentially depositing an impurity-doped amorphous silicon layer, at least two metal layers, and a second photoresist layer;
    exposing the second photoresist layer to light using a mask including a transmissive portion, a semi-transmissive portion and a blocking portion;
    developing the second photoresist layer to form fourth and fifth photoresist portions corresponding to the blocking portion and the semi-transmissive portion, respectively, wherein the fourth photoresist portion is thicker than the fifth photoresist portion, and wherein a portion of the second photoresist layer corresponding to the transmissive portion is removed;
    etching the at least two metal layers and the impurity-doped amorphous silicon layer using the developed second photoresist layer to form the source and drain electrodes and the data line below the fourth photoresist portion, metal patterns below the fifth photoresist portion, the first and second ohmic contact layers below the source and drain electrodes, and the impurity-doped amorphous silicon pattern below the data line and the metal patterns;
    ashing the developed second photoresist layer to remove the fifth photoresist portion;
    removing top layers of the metal patterns using the ashed fourth photoresist portion to form the pixel and common electrodes, the gate pad terminal electrode and the data pad electrode; and
    removing the ashed fourth photoresist portion.

5. The method according to claim 4, further comprising heating the ashed fourth photoresist portion to cover the data line, the source and drain electrodes, the first and second ohmic contact layers and the impurity-doped amorphous silicon pattern below the data line before removing the top layers of the metal patterns.

6. The method according to claim 4, further comprising forming a connection portion at the same processes of forming the pixel electrode, wherein the connection portion overlaps the gate line and is connected to the pixel electrode.

7. The method according to claim 4, wherein the at least two metal layers are two metal layers having first and second layers deposited sequentially, the first layer is formed of at least one of molybdenum and molybdenum alloy, and the second layer is formed of at least one of copper, copper alloy, aluminum and aluminum alloy.

8. The method according to claim 4, wherein the at least two metal layers are three metal layers having first to third layers deposited sequentially, the first layer is formed of at least one of molybdenum and molybdenum alloy, the second layer is formed of at least one of indium-tin oxide, indium-zinc-oxide and indium-tin-zinc-oxide, and the third layer is formed of at least one of copper, copper alloy, aluminum and aluminum alloy.

9. The method according to claim 8, wherein the first layer has a thickness of about 30 Å to 60 Å.

* * * * *